United States Patent [19]
Kojima et al.

[11] Patent Number: 5,630,314
[45] Date of Patent: May 20, 1997

[54] THERMAL STRESS RELAXATION TYPE CERAMIC COATED HEAT-RESISTANT ELEMENT

[75] Inventors: Yoshitaka Kojima; Hideyuki Arikawa, both of Hitachi; Mitsuo Haginoya, Ibaraki; Akira Mebata, Kitaibaraki; Tetsuo Sasada; Hajime Toriya, both of Hitachi, all of Japan

[73] Assignee: Hitachi, Ltd., Tokyo, Japan

[21] Appl. No.: 320,780

[22] Filed: Oct. 11, 1994

Related U.S. Application Data

[63] Continuation-in-part of Ser. No. 118,641, Sep. 10, 1993, abandoned.

[30] Foreign Application Priority Data

Sep. 10, 1992 [JP] Japan ................. 4-266889

[51] Int. Cl.⁶ .................................... F02C 6/18
[52] U.S. Cl. ................ 60/39.182; 416/241 B; 428/623
[58] Field of Search ............. 60/39.182; 416/241 B; 428/622, 623, 633

[56] References Cited

U.S. PATENT DOCUMENTS

| | | | |
|---|---|---|---|
| 3,420,054 | 1/1969 | Sheldon | 60/39.182 |
| 4,676,994 | 6/1987 | Demaray | 427/42 |
| 4,966,820 | 10/1990 | Kojima et al. | 428/622 |
| 5,209,645 | 5/1993 | Kojima et al. | 416/241 B |

*Primary Examiner*—Louis J. Casaregola
*Attorney, Agent, or Firm*—Antonelli, Terry, Stout & Kraus

[57] ABSTRACT

The present invention provides ceramic coated heat-resistant elements which suffer no damages even under high heat load conditions and can afford a thermal barrier effect stably for a long period of time and can be used, for example, as buckets and stationary blades of turbines. A method for making the elements is also provided. The ceramic coated heat-resistant element comprises a heat resisting alloy base mainly composed of Ni and/or Co and a heat-resistant coating layer provided on the surface of the base and is characterized in that said heat-resistant coating layer comprises a metal layer of an alloy superior to the base in high-temperature corrosion and oxidation resistance and provided on the base, an $Al_2O_3$ ceramic thin film layer provided on the metal layer, a $ZrO_2$ ceramic coating layer having dense texture provided on the $Al_2O_3$ ceramic thin film layer and a $ZrO_2$ ceramic coating layer having columnar texture provided on the $ZrO_2$ ceramic coating layer having dense texture and cracks are present only in said $ZrO_2$ ceramic coating layer having columnar texture in the direction of thickness along the boundary of the columns. A mixed layer composed of a metal superior to the base in high-temperature corrosion and oxidation resistance and a $ZrO_2$ ceramic may be provided between the base and the metal layer.

2 Claims, 9 Drawing Sheets

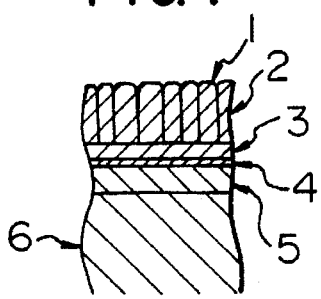
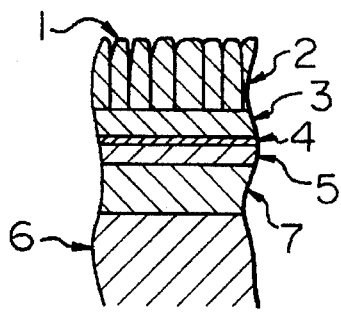
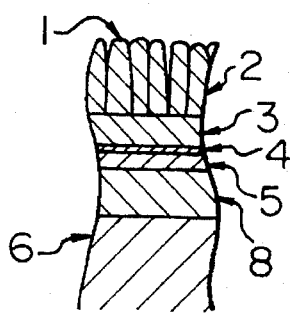
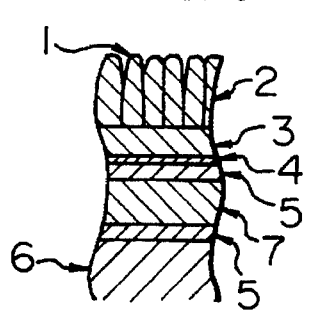
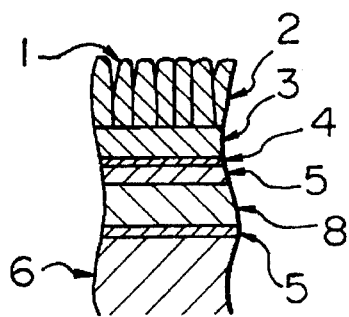
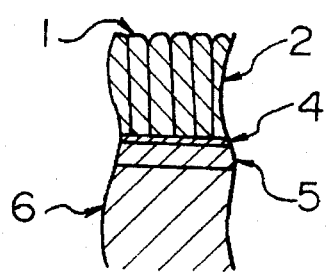
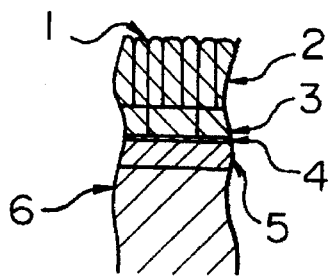

150μm

F I G. 16
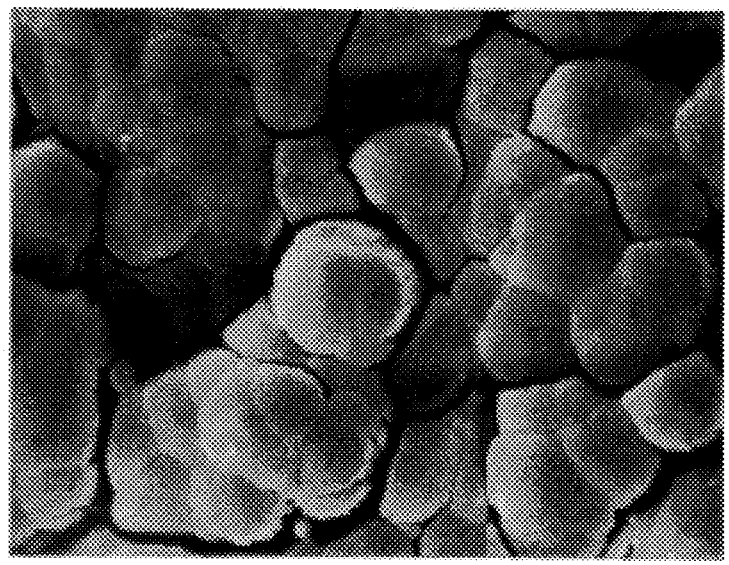
150μm

THERMAL STRESS RELAXATION TYPE CERAMIC COATED HEAT-RESISTANT ELEMENT

CROSS-REFERENCE TO RELATED APPLICATION

This application is a continuation-in-part application of Ser. No. 08/118,641, filed on Sep. 10, 1993, now abandoned.

BACKGROUND OF THE INVENTION

1. Field of the Invention

The present invention relates to a heat-resistant element provided with a coating layer and particularly, to a thermal stress relaxation type ceramic coated heat-resistant member and a method for making such element.

2. Description of the Related Art

Heat-resistant parts represented by gas turbines for electricity generation are increasingly subjected to higher operation temperature for improvement of efficiency. As a result, improvement of high-temperature endurance of stationary blades and buckets of turbines which are heat-resistant parts are earnestly demanded. Under the circumstances, heat resisting alloys high in high-temperature strength and excellent in reliability have been developed, but they are limited in their heat resisting temperature. As a method for reducing the temperature of base metals of parts used under high temperature condition, there is the thermal barrier coating (hereinafter abbreviated as "TBC") which is a coating of ceramics of low thermal conductivity (such as $ZrO_2$ type ceramics). According to this TBC, the temperature of base metals can be reduced by 50°–100° C.

However, the TBC which is employed under severe heat load conditions is apt to cause damages such as peeling of coating layers such as ceramic layers. Especially, in the case of gas turbines operated at high temperatures for improving efficiency, the heat load conditions are very severe and damages are caused more readily.

There are heat-resistant parts coated with various thermal stress relaxation type ceramics (U.S. Pat. Nos. 4,503,130 and 4,095,003). A ceramic coating layer having the laminate structure comprising a porous ceramic layer and a dense ceramic layer and a coating layer comprising columnar ceramics are proposed in these known techniques.

However, in the case of the ceramic coating layer of laminate structure, the residual strain in the laminate ceramic coating layer is controlled by control of base temperature at the time of film-forming and by forming a porous ceramic layer by thermal spraying of a mixture of ceramic powders and polyesters and damages occur in the ceramic coating layer under very severe heat load conditions. On the other hand, in the case of the coating layer comprising columnar crystal ceramics, improvement in endurance by the thermal stress relaxation action is recognized, but peeling also occurs at the boundary part between the ceramic coating layer and the lower layer under very severe heat load conditions.

As mentioned above, in the case of heat-resistant parts provided with conventional thermal stress relaxation type ceramic coating layer, the ceramic coating layer is often damaged under severe heat load conditions of high operation temperature and the thermal barrier effect which is the original object of providing the layer cannot be sufficiently exhibited.

The above known techniques propose ceramic coating layers having thermal stress relaxing function. However, all of them do not necessarily show sufficient heat resistance when used for parts operated under high heat load conditions of high operation temperatures.

As a result of studying the thermal stress relaxing function, it has been found by thermal stress analysis that $ZrO_2$ ceramic coating layer smaller in thermal expansion provided on the surface of a base made of a heat resisting alloy larger in thermal expansion undergoes tensile stress under severe heat load conditions of high operation temperatures. It has been further found that this tensile stress shows such a distribution that it becomes greatest in the ceramic coating layer in the vicinity of the boundary part between the ceramic coating layer and the under layer (such as an alloy layer) and when the maximum stress exceeds the strength of the ceramic coating layer, break of the ceramic layer is brought about.

Being different from sintered ceramics, the texture of ceramic coating layers have various structures. Such difference in the texture results in a great difference in the form of breaking of the ceramic coating layers. That is, in the case of porous particulate stacking texture which is low in inter-particle bonding force, wear loss of the ceramic coating layer results due to exfoliation phenomenon of particles. Such texture can be produced, for example, by the known thermal spraying of a mixture of $ZrO_2$ ceramic particles and polyester powders.

Next, in the particulate stacking texture relatively strong in interparticle bonding force and having internal defects such as voids, breaking occurs in the longitudinal direction of the coating layer to result in cracks. This is because the strength of the ceramic coating layer in such textural structure is low, namely, several $kg/mm^2$. Furthermore, since such a particle stacking texture has many stacking defects of particles in transverse direction of the coating layer, cracks also occur in the transverse direction due to breaking and the coating layer peels off in the stress state where a shear force is produced (for example, when there is a temperature distribution and local heating occurs). Such stacking texture can be produced by thermal spraying of $ZrO_2$ type particles.

As for the coating layer of dense texture having substantially no internal defects, since the strength of the layer is equal to or higher than that of sintered materials, neither impact nor flex cracks occur in longitudinal or transverse direction in the coating layer. Rather, since adhesiveness between the ceramic coating layer and the under layer (such as an alloy coating layer) is smaller, peeling at the boundary part is brought about owing to the shear stress. The coating layer of such texture can be produced by vapor deposition of $ZrO_2$ type materials by an electron beam under the condition of 500° C. or lower in the temperature of bases (corresponding to parts). On the other hand, in the case of a ceramic coating layer composed of a dense ceramic which has columnar texture, the strength of the ceramic coating layer is low at the boundary part (grain boundary) of the respective columns. Accordingly, due to tensile stress, breaking occurs in the longitudinal direction of the coating layer along the grain boundary, resulting in a great number of micro-cracks. It is known that such texture can be produced by vapor deposition of $ZrO_2$ materials by an electron beam under the condition of 500° C. or higher, preferably 700° C. or higher in the base temperature.

As mentioned above, $ZrO_2$ ceramic coating layer for TBC shows a breaking form peculiar to its texture. When the various breaking forms are compared, columnar texture is most advantageous as ceramic coating layers for TBC. In this case, it can be supposed that since the thermal stress generated in the ceramic coating layer is relaxed by the micro-cracks, wear or peeling is difficult to occur and the thermal barrier effect of TBC can be maintained for a long time. Such fact is disclosed in an ASME meeting material ('91-GT-40).

As a result of research on the above ceramic coating layer of columnar texture as TBC for heat-resistant parts of gas turbines or aircraft engines operated at very high temperatures, the inventors have clarified that the ceramic coating layers having the columnar texture do not necessarily have sufficient heat resistance. That is, under the heating condition of the heat flux being 2–4 MW/m$^2$ which is a severe heat load condition, TBC which is provided with the above-mentioned ceramic coating layer having columnar texture shows peeling at $Al_2O_3$ layer of several μm provided under the $ZrO_2$ columnar texture ceramic coating layer in the vicinity of the boundary part between the $Al_2O_3$ layer and an alloy coating layer provided under the $Al_2O_3$ layer. Such breaking phenomenon coincides with the form of damage reported in the above material ('91-GT-40). In the case of the heating condition of high heat flux employed by the inventors, the number of repetition of heating and cooling until the peeling started was several times. Thus, under very severe heating conditions, the ceramic coating layer having columnar texture which has been considered to have thermal stress relaxation action has not been necessarily satisfactory.

Results of investigation by the inventors on such unexpected result will be explained below. Micro-cracks in the longitudinal direction uniformly occurred along the respective grain boundaries of columnar texture in the ceramic coating layer having columnar texture by one heating. Therefore, when it is used as TBC of heat-resistant parts, it has been essential to provide a dense $Al_2O_3$ layer as an environmental barrier layer for inhibiting high-temperature corrosion and oxidation through the micro-cracks. Since $Al_2O_3$ and $ZrO_2$ have some solution limit, they interdiffuse under heating at high temperatures and the $ZrO_2$ ceramic coating layer and the $Al_2O_3$ layer strongly adhere to each other. However, $Al_2O_3$ and the alloy layer provided thereunder have no solution limit and adhesion between them is weak.

Accordingly, it can be considered that a thick coating layer of columnar texture comprising $ZrO_2$ ceramic and a very thin environmental barrier layer comprising $Al_2O_3$ can be regarded to be integral when thermal stress is considered. In such coating layer, micro-cracks are present at boundaries of columns, namely, the layer is the thermal stress relaxation type ceramic coating layer and nevertheless damage occurs when heat load is large. The reason is considered as follows. The thermal stress generated by heat load is a driving force for breaking of the ceramic coating layer, but the breaking phenomenon governs the damage and the mechanism of breaking caused by thermal stress is a great factor. Therefore, the position of starting point of breaking is important in considering the mechanism of breaking. In the columnar texture $ZrO_2$ ceramic coating layer, micro-cracks present along the boundary of the columns reach the boundary between the $ZrO_2$ coating layer and the $Al_2O_3$ layer.

As a result of analysis of thermal stress, in the coating layer of the above-mentioned structure, the tensile stress becomes maximum in the vicinity of the boundary between the $ZrO_2$ coating layer and the $Al_2O_3$ layer. The maximum value increases with the heat load condition becoming severer. On the other hand, when breaking mechanism is considered, the starting point of breaking in the coating layer of such structure is the head of the micro-cracks, namely, the end of the individual columnar bodies of $ZrO_2$ coating layer segmented at the boundary between the coating layer and the $Al_2O_3$ layer. The thermal stress around the starting point of breaking is the largest. As a result, it can be considered that under the condition of severe heat load, the thermal stress at the starting point of breaking exceeds the strength of material to bring about breaking phenomenon, resulting in damages. While the coating layer of this structure has the thermal stress relaxing action due to the micro-cracks, damage has occurred under the condition of severe heat load. The reason is considered that there is a problem in construction of materials around the starting point of breaking. That is, it can be pointed out that the $Al_2O_3$ layer susceptible to thermal shock is present under the starting point of breaking and the $Al_2O_3$ layer is thin, namely, several μm and when cracks occur in the $Al_2O_3$ layer, there is the boundary part between the $Al_2O_3$ layer and the alloy coating layer which is lowest in strength.

The $ZrO_2$ coating layer comprises a ceramic excellent in thermal shock resistance which comprises $ZrO_2$ and a stabilizer for inhibiting phase transformation such as $Y_2O_3$, MgO, CaO or the like while $Al_2O_3$ is considerably inferior in thermal shock resistance owing to the phase transformation of $\alpha \leftrightarrow \gamma$. Therefore, $Al_2O_3$ layer is a material readily broken due to ON/OFF of heat load and the like. The coating layer of this structure has its effectiveness in relaxation of thermal stress, but does not have sufficient endurance under the severe condition of a great heat load for the reasons that from the point of breaking mechanism, an $Al_2O_3$ layer is present at the break starting point and boundary part between the $Al_2O_3$ layer and the alloy coating layer is present just below the $Al_2O_3$ layer. In this case, as aforementioned, the $Al_2O_3$ layer is a barrier layer essential for obtaining corrosion resistance and the $Al_2O_3$ layer cannot be omitted in $ZrO_2$ ceramic coating layers of columnar texture.

As a result of the investigation referred to hereabove, the inventors have noticed the break starting point which governs the breaking of coating layers induced by thermal stress and they have accomplished the present invention. That is, for relaxing the thermal stress and diminishing its maximum tensile stress in the $ZrO_2$ ceramic coating layer having columnar texture, it is very effective to produce micro-cracks along the boundary of the columns. However, when the breaking mechanism is considered, the material at the head of the micro-cracks and construction of materials around the micro-cracks are very important.

For forming $ZrO_2$ ceramic coating layers having columnar texture and having micro-cracks, a method has been proposed which comprises carrying out electron beam vapor deposition of $ZrO_2$ ceramic materials on a base kept at a temperature of 538°–816° C. (U.S. Pat. No. 4,095,003). Furthermore, similarly, a $ZrO_2$ ceramic coating layer having a dense texture is obtained at a temperature lower than 538° C. Accordingly, a $ZrO_2$ coating layer comprising different compositions of dense texture and columnar texture can be formed by firstly vapor depositing a $ZrO_2$ material on an alloy coating layer having an $Al_2O_3$ layer of several micrometers thick on the uppermost surface at a base preheating temperature of lower than 538° C. and then evaporating the $ZrO_2$ material at a base preheating temperature of 538°–816° C. to form a $ZrO_2$ coating layer having columnar texture. In this case, however, when the upper $ZrO_2$ coating layer comprising columnar texture is formed by raising the base temperature after the lower $ZrO_2$ coating layer comprising dense texture has been formed, a thermal stress (tensile stress) is generated in the lower $ZrO_2$ coating layer comprising dense texture due to the preheating of the base at the high temperature and cracks are generated in the longitudinal direction in the lower $ZrO_2$ coating layer. Thus, the upper $ZrO_2$ coating layer comprising columnar texture is formed on the lower $ZrO_2$ coating layer having the cracks.

Accordingly, in the case of TBC having $ZrO_2$ coating layer of such two-layer structure, cracks in the longitudinal direction occur along the columnar boundary of the $ZrO_2$ coating layer having columnar texture at the time of heating as an after-treatment or at the time of using as turbine parts. As a result, both the lower and upper $ZrO_2$ coating layers have the cracks in the longitudinal direction and are insufficient as the $ZrO_2$ coating layer of two-layer structure of the present invention. That is, the head of cracks extends to the $Al_2O_3$ layer of several μm thick and to the vicinity of the boundary between the $Al_2O_3$ layer and the alloy coating layer thereunder and the starting point of breaking caused by thermal stress is present in the portion where damages of $ZrO_2$ coating layer (such as peeling) occur with ease.

SUMMARY OF THE INVENTION

The object of the present invention is to provide thermal stress relaxation type ceramic coated heat-resistant elements having sufficient endurance under severe heat load conditions of high operation temperature, a method for producing them and ceramic coated buckets and stationary blades of gas turbines.

BRIEF DESCRIPTION OF THE DRAWINGS

FIG. 1 is a schematic sectional view of a ceramic coating layer.

FIG. 3 is a schematic sectional view of a ceramic coating layer.

FIG. 4 is a schematic sectional view of a ceramic coating layer.

FIG. 5 is a schematic sectional view of a ceramic coating layer.

FIG. 6 is a schematic sectional view of a ceramic coating layer.

FIG. 7 is a schematic sectional view of a ceramic coating layer.

FIG. 8 is a schematic sectional view of a ceramic coating layer.

FIG. 16 is a scanning electron micrograph which shows the cross-section of a ceramic coating layer layer.

DETAILED DESCRIPTION OF PREFERRED EMBODIMENTS

Figure 2:
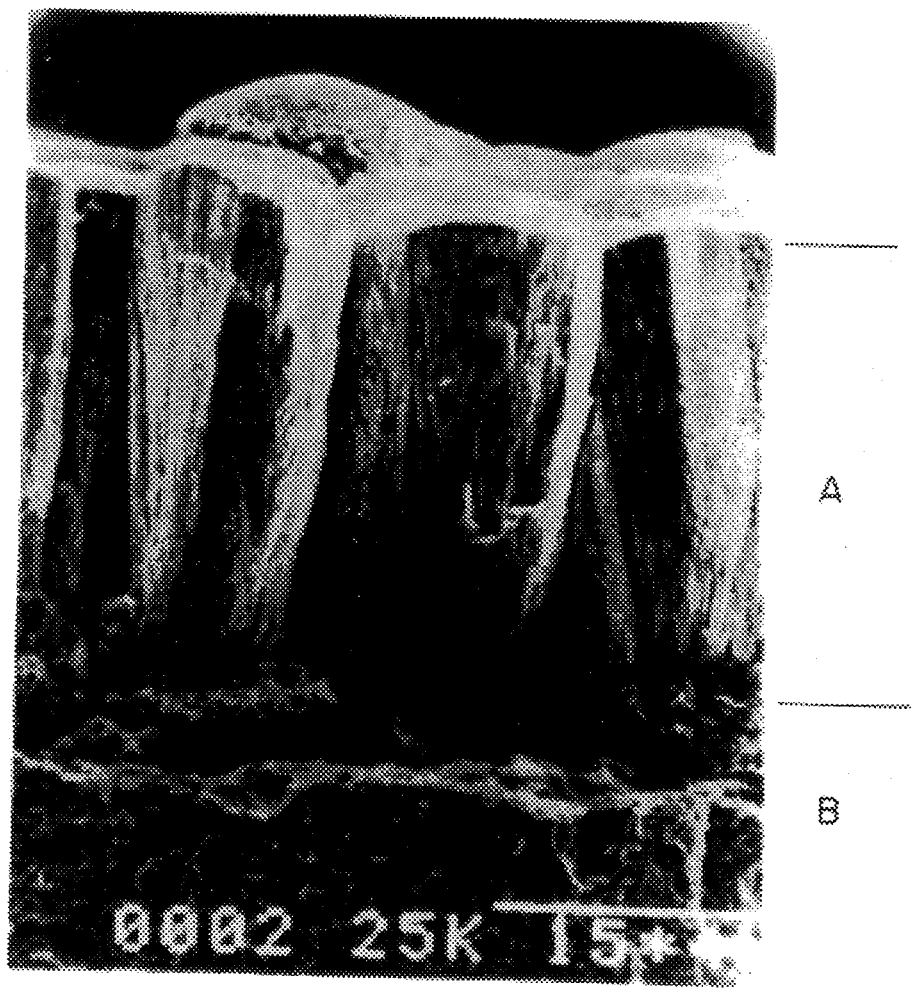
FIG. 2 is a scanning electron micrograph which shows the cross section of a ceramic coating layer.

For attaining the above object, the present invention provides a ceramic coated heat-resistant element comprising a heat resisting alloy base mainly composed of Ni and/or Co and a heat-resistant coating layer provided on the surface of the base wherein said heat-resistant coating layer comprises a metal layer of an alloy superior to the base in high-temperature corrosion and oxidation resistance and provided on the base and, provided thereon in succession, an $Al_2O_3$ ceramic thin film layer, a $ZrO_2$ ceramic coating layer having dense texture and a $ZrO_2$ ceramic coating layer having columnar texture and cracks are present only in the $ZrO_2$ ceramic coating layer having columnar texture in the direction of thickness along the boundary of the columns.

Preferably, a mixed layer composed of a metal superior to the base in high-temperature corrosion and oxidation resistance and a $ZrO_2$ ceramic is provided between the base and the metal layer of the above ceramic coated heat-resistant member or a mixed layer composed of a metal superior to the base in high-temperature corrosion and oxidation resistance and a $ZrO_2$ ceramic with the mixing ratio of the metal and the $ZrO_2$ ceramic continuously changing from the metal on the base side to the $ZrO_2$ ceramic on the metal layer side is provided between the base and the metal layer. Furthermore, preferably an additional metal layer is provided between the base and the mixed layer.

Said metal layer is preferably an alloy comprising Co and/or Ni as main components and at least one of Cr, Al and Y. Said $ZrO_2$ ceramics preferably comprise $ZrO_2$ as a main component and at least one of $Y_2O_3$, MgO and CaO.

Preferably, the dense $ZrO_2$ ceramic layer has a thickness of 10–60 μm, the value of (thickness of the $ZrO_2$ ceramic layer having columnar texture)/(thickness of the dense $ZrO_2$ ceramic layer) is 1.5–15, and total thickness of the dense $ZrO_2$ ceramic layer and the $ZrO_2$ ceramic layer having columnar texture is 400 μm or less. Furthermore, preferably, the cracks produced in the $ZrO_2$ ceramic coating layer having columnar texture have an opening width of 5–20 μm and the size of individual columns which constitute the columnar texture is in the range of 20–200 μm.

The present invention further relates to a method for producing the above-mentioned heat-resistant member comprising a heat resisting alloy base mainly composed of Ni and/or Co and a heat-resistant coating layer provided on the surface of the base which comprises a step of forming a metal layer of an alloy superior to the base in high-temperature corrosion and oxidation resistance by plasma spraying and steps of forming thereon in succession an $Al_2O_3$ ceramic thin film layer, a $ZrO_2$ ceramic coating layer having dense texture by electron beam vapor deposition and a $ZrO_2$ ceramic coating layer having columnar texture by simultaneously carrying out electron beam vapor deposition and ion beam irradiation and thereafter forming cracks in the $ZrO_2$ ceramic coating layer having columnar texture in the direction of thickness along the boundary of the columns.

In the above method, the ion beam irradiation is preferably carried out under an accelerating voltage of 1–50 kV and the main element which constitutes the ion beam is preferably oxygen.

The present invention further relates to bucket and stationary blade parts of gas turbines comprising a heat resisting alloy mainly composed of Ni and/or Co where a metal layer of an alloy superior to said heat resisting alloy in high-temperature corrosion and oxidation resistance is provided on the whole surface or a part of the portion of said parts which is exposed to combustion gas, an $Al_2O_3$ ceramic thin film layer is provided on the metal layer, a $ZrO_2$ ceramic coating layer having dense texture is provided on the $Al_2O_3$ ceramic thin film layer and a $ZrO_2$ ceramic coating layer having columnar texture is provided on the $ZrO_2$ ceramic coating layer having dense texture and cracks are present only in the $ZrO_2$ ceramic coating layer having columnar texture in the direction of thickness along the boundary of the columns.

Furthermore, a part of the portion of buckets and stationary blades of gas turbines which is exposed to combustion gas can be leading edge portion of the blades and the metal layer of an alloy superior to the heat resisting alloy in high-temperature corrosion and oxidation resistance can be provided on other portion exposed to combustion gas and the $ZrO_2$ ceramic layer can be provided on said metal layer. Moreover, the base metals which constitute the bucket and stationary blades of gas turbines are preferably polycrystalline materials, unidirectionally solidified materials or single crystal materials.

Furthermore, according to the present invention, it has become possible to obtain a thermal stress relaxation type ceramic coated heat resistant element which comprises a heat-resisting alloy base mainly composed of Ni and/or Co and a heat resistant coating layer provided on the surface of the base wherein the uppermost $ZrO_2$ ceramic coating layer has a hybridized columnar texture composed of columnar texture (tertiary columnar texture) comprising one or two or more columnar textures (secondary columnar textures) composed of an aggregate of $ZrO_2$ ceramic columnar textures (primary columnar textures). The $ZrO_2$ ceramic preferably comprises $ZrO_2$ as a main component and at least one compound selected from CdO, MgO and $Y_2O_3$.

The primary columnar texture is a micro-texture of 1–10 μm in width and the secondary columnar texture is a columnar body of 20–200 μm in width comprising an aggregate of the primary columnar textures. Furthermore, the tertiary columnar texture is one or an aggregate of a plurality of the secondary columnar textures which are divided by microcracks (5–20 μm width). The width of the tertiary column is 20–600 μm. These columnar textures are all in nearly parallel to the direction of the thickness of the coating layer. The ceramic coating layer of such structure highly relaxes the thermal stress which is caused by the difference in thermal expansion of the ceramic coating layer and the base and which is generated in vertical direction to the direction of the thickness of the coating layer. The reason therefor is as follows. In connection with the roles of the respective columnar textures of from primary to tertiary textures, since a lot of directions of crystal growing in the primary columnar texture are nearly uniform in one direction, the strength in the growing direction is high and that in the direction vertical to the growing direction is namely, so-called fiber-reinforced structure is formed and upon application of external force, for example, by thermal stress, micro flaws are produced in the direction of low strength and as a result, the effect to relax the external force (thermal stress) occurs. The secondary columnar texture is an aggregate of the primary columnar textures and this aggregate is uniform in the growing direction of the texture or in one direction and the bonding power at boundary of the respective secondary columnar textures is smaller than the strength in the growing direction. Therefore, when an external force (thermal stress) is applied, micro-cracks are produced at the boundary of the secondary columnar textures which is smaller in bonding power to exhibit the effect to relax the external force. The tertiary columnar texture comprises one or a plurality of aggregates of the secondary columnar textures and there are micro-cracks at the boundary thereof and the thermal stress is reduced (relaxation of thermal stress) by the size effect exhibited by the coating layer being finely divided to the size of the tertiary columnar texture since the tertiary columnar textures are respectively independent in their shape. As explained above, the heat resistant element of the present invention provided with a ceramic coating layer can be used even under the conditions at which various known ceramic layers are damaged owing to the thermal stress relaxing effect exhibited by hybridization of the respective primary, secondary and tertiary columnar textures even when it is used as a heat resistant element which is exposed to severe heat loading conditions of high operating temperature. FIG. 1 is a schematic sectional view of a heat barrier coating provided with the ceramic coating layer of hybridized columnar texture of the present invention. The construction of the layer under the ceramic coating layer has no special limitation, but desirably an $Al_2O_2$ layer is present under the ceramic coating layer and an MCrAlY layer (M is Co or Ni or combination of them) is present under the $Al_2O_2$ layer as shown in FIG. 1. The $Al_2O_3$ layer and the MCrAlY layer have the action to prevent the external oxidation and high-temperature corrosion caused through micro-cracks.

Figure 15:
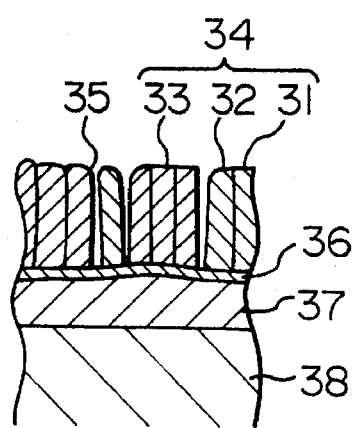
FIG. 15 is a schematic sectional view of a ceramic coating layer.
Figure 17:
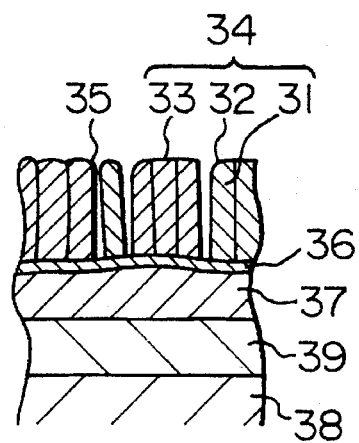
FIG. 17 is a schematic sectional view of a ceramic coating layer.

What is important for obtaining the coating layer of the present invention as shown in FIG. 15 is to form the layer with applying an energy thereto and to enhance the adhesion between the ceramic layer and the layer under the ceramic layer as shown below. Unless such means are employed, the ceramic coating layer of the present invention cannot be obtained. First, as the general method to apply energy to the ceramic coating layer during being formed, mention may be made of heating of the base to apply heat energy. In the case of physical vapor deposition (PVD) according to which a $ZrO_2$ ceramic is molten by electron beam or the like and the evaporated particles of the $ZrO_2$ ceramic are deposited on the surface of the base, there is a method of growing the particles deposited on the base by raising the temperature of the base in addition to utilizing the energy possessed by the evaporated particles and controlling the growing process. In this case, when the base temperature is low, since crystal growing of the formed ceramic layer is difficult to proceed offer deposition of the evaporated particles, the texture becomes fine crystal grains. The inventors have also made the similar investigation and as a result, it has been found that in electron diffraction experiment on the ceramic layer by a transmission type electron microscope, no specific diffraction point which shows crystal growth is seen and nearly ring-like diffraction line is obtained and crystal grains are fine. That is, the columnar textures cannot be obtained. On the other hand, when the layer is formed at a base temperature of 700° C. or higher, a ceramic coating layer obtained comprises columnar textures of several μm due to the crystal growth of evaporated particles after having been deposited. In this case, however, the ceramic coating layer comprises only the columnar texture of nearly uniform size several μm). Furthermore, when the base temperature is increased (1000° C.), the size of the columnar texture merely increases a little as compared with the size when the base temperature is 700° C. Further, in the case of formation of the layer at 1000° C., cracks are produced which divide the surface of the ceramic coating layer to a size of the order of several mm at the time of cooling after the formation and partial peeling of the ceramic coating layer is seen. Thus, only the columnar ceramic texture of several μm can be obtained by the heating of the base which is employed as a method for imparting energy for $ZrO_2$ ceramic formed by PVD. Furthermore, according to the hear treatment after the formation of the layer, the width of cracks is large (0.1–0.5 mm) and the size divided by the cracks is also large because the ceramic coating layer has a uniform texture comprising columns of several μm in width.

On the other hand, for obtaining a ceramic coating layer of the primary to tertiary hybrid columnar texture, the inventors have paid attention to the ion beam energy as a means to impart energy to the ceramic coating layer during formation of the layer. In the case of the ion beam energy, depth of implantation of ion beam is determined by the accelerating voltage. The accelerating voltage the inventors have noticed is 1–50 kV and an implanting effect of several hundred Å can be expected by such accelerating voltage. Furthermore, by simultaneously affecting the evaporation and the ion beam irradiation, energy of the ion beam can be imparted to a depth of several hundred Å from the surface of the layer when The layer is formed at an evaporation rate of several ten Å/sec. Since most of the energy of the implanted ion beam changes to heat energy, the layer is heated to the depth of several hundred Å from the surface. It is important here that since the $ZrO_2$ ceramic dealt with by the inventors is small in thermal conductivity the heat energy of the implanted ion beam is apt to be concentrated to only the portion in the vicinity of surface of the layer. Therefore, PVD which simultaneously carries out vapor deposition and ion beam irradiation can give a large heat energy to the portion near the surface of the layer in formation of a $ZrO_2$ ceramic layer.

Next, the ion beam has a specific action also in improving the adhesion between the ceramic coating layer and the layer under the ceramic coating layer. That is, a mixed layer of the under layer and the ceramic layer is formed at the interfacial boundary by the sputtering action of the ion beam. The mixed layer formed by using ion beam causes enhancement of the adhesion. The main element which constitutes the ion beam is preferably oxygen. This is because it covers up the deficiency of oxygen in vapor deposition of $ZrO_2$ ceramics and a stoichiometric ceramic can be obtained.

By employing the process having the above characteristics and toughening the layer under the ceramic coating layer (surface roughness Rmax. 50–80 μm), the hybridized columnar ceramic coating layer of the present invention can be obtained in the following manner. According to the PVD method comprising only vapor deposition, e uniform texture comprising columnar texture in the order of several μm by increasing the temperature of the base (600°–800° C.).

However, it is difficult to obtain a columnar texture (secondary column) in the order of 20–200 μm which comprises an aggregate of columnar textures (primary columns) in the order of several μm. The reason is as follows. When the surface roughness of the layer under the ceramic coating layer is increased in order to obtain secondary columns, the ceramic coating layer readily peels off. Even if it does not peel off, the texture comprises mostly columns of several μm and a column (secondary column) of 20–200 μm which is an aggregate of columns (primary columns) of several μm are hardly formed. Furthermore, when the base temperature is further raised to 1000° C., clear secondary columns are produced with difficulty and cooling after formation causes peeling of the ceramic coating layer as mentioned above.

The secondary columnar texture which constitutes the hybridized columnar texture of the present invention has hitherto been considered to be a defect of the coating layer in the case of the conventional PVD comprising only vapor deposition and rather care has been taken not to form such texture, and a uniform ceramic coating layer comprising only the columns in the order of several μm (called the primary columns in the present invention) has been formed and a heat barrier coating of high reliability has been obtained only by the thermal stress relaxing action of the ceramic coating layer (U.S. Pat. No. 4,321,370). This is because a process in which both the applied energy at formation and the adhesion to the under layer are small has been employed. The inventors have found a method for obtaining a conventionally unobtainable ceramic coating layer of hybridized columnar texture excellent in thermal stress relaxation characteristics and comprising primary columns of several μm and secondary columns of 20–200 μm which are aggregates of the primary columns by using ion beam and vapor deposition in combination and by toughening the surface of the under layer. Such coating layer was not able be formed by the conventional film forming method or even if was able to be formed, the layer adversely became a defect.

Furthermore, by subjecting the element having the resulting ceramic coating layer of hybridized columnar texture to a uniform heat treatment, micro-cracks are produced in a part of the boundary of the secondary columns due to thermal stress caused by the difference in thermal expansion of the base and the ceramic coating layer and as a result, a tertiary columnar texture comprising one or two or more secondary columns can be obtained. In this case, too, according to the method of the inventors, the breakage caused by thermal stress occurs along a part of the boundary of the secondary column since the strength between the secondary columnar textures is lower than the strength between the primary columnar textures. The width of the micro-cracks between the thus obtained tertiary columnar textures is 5–20 μm and the micro-cracks also have the thermal stress relaxing action. The tertiary Columns divided by the micro-cracks are composed of one or a plurality of secondary columns and have a size of 20–600 μm. In such method of the present invention, the heating temperature is preferably 850°–200° C. for generating the micro-cracks by the thermal stress. By carrying out the uniform heating at a temperature in the above range, the tertiary columnar texture is obtained due to the thermal stress generated by the difference in thermal expansion of the base and the ceramic coating layer. The heating temperature is preferably equal to the heat treating temperature of the super alloy used as the base.

The inventors have subjected to a uniform heat treatment an element having a ceramic coating layer comprising primary columnar texture which is formed by PVD comprising only vapor deposition. As a result, there has been seen generation of cracks caused by the breakage of the ceramic coating layer due to the thermal stress, but when the layer comprises only primary columnar texture, since the strength in the ceramic coating layer is nearly uniform, the layer is divided by the micro-cracks into a large size of several hundred μm—several mm and the width of the micro-cracks is also large, namely, 0.1–0.5 μm. The ceramic coating layer divided into such large units can be expected to show some thermal stress relaxation, but the effect of relaxation is smaller than the hybridized columnar ceramic coating layer of the present invention.

The elements constituting the ion beam used in the present invention have no special limitation, but oxygen is preferred for supplying the deficiency of oxygen of $ZrO_2$ ceramics in vapor deposition and for obtaining $ZrO_2$ of stoichiometric composition. No special trouble occurs even when ion beams such as $N_2$, Ar and the like are used.

According to the method of the present invention as explained above, a hybridized columnar ceramic coating layer comprising primary to tertiary columnar textures is obtained. Furthermore, since the element provided with the coating layer of the present invention is excellent in thermal stress relaxation characteristics, when the element is used as a hear barrier coating of high temperature parts of gas turbines of high combustion gas temperature, damages such as peeling of the ceramic coating layer hardly occur even when starting and stopping of the gas turbines are repeated or the gas turbines are used for a long time, and thus the effect to lower the temperature of the base which is a purpose of the heat barrier coating can be maintained.

The present invention relates to a bucket for gas turbines which has a blade part, a platform having flat portion connected to the blade part, a shank part connected to the platform, a fin comprising projections provided on both sides of the shank part and a dovetail connected to the shank part, characterized in that a heat-resistant coating layer is provided on the surface of said blade part and the heat-resistant coating layer comprises a base, a metal layer comprising an alloy superior to the base in high-temperature corrosion and oxidation resistance and provided on the base, and an $Al_2O_3$ ceramic thin film layer, a $ZrO_2$ ceramic coating layer comprising a dense particulate texture and a $ZrO_2$ ceramic coating layer of columnar texture which are provided in succession on the metal layer cracks being present only in the $ZrO_2$ ceramic coating layer of columnar texture in the direction of thickness along the boundary of the columns.

The bucket is further characterized in that a heat-resistant coating layer is provided on the surface of said blade part and a $ZrO_2$ ceramic layer constituting the heat-resistant coating layer is formed of a columnar texture (tertiary columnar texture) comprising one or more columnar textures (secondary columnar texture) composed of an aggregate of many columnar textures (primary columnar textures) of $ZrO_2$ ceramic, said tertiary columnar texture being divided by micro-cracks.

The present invention relates to a gas turbine in which the bucket provided at a disk is rotated by allowing a combustion gas compressed by a compressor to collide against the bucket through a nozzle, characterized in that the nozzle and the bucket have at least three stages, at least the first stage of the bucket has a blade part, a platform having flat connected to the blade part, a shank part connected to the platform, a fin comprising projections provided on both sides of the shank part and a dovetail connected to the shank part, and the heat-resistant coating layer is provided on the surface of the blade part of at least one of the bucket and the nozzle.

The present invention relates to a gas turbine in which the bucket provided at a disk is rotated by allowing a combustion gas compressed by a compressor to collide against the bucket through a nozzle, characterized in that temperature the combustion gas is 1500° C. or higher, it has at least three stages of the buckets, temperature of the combustion gas at the inlet of the first stage of the bucket is 1300° C. or higher, the whole length of the first stage of the bucket is at least 200 mm, the first stage of the bucket has a blade part, a platform having flat portion connected to the blade part, a shank connected to the platform, a fin comprising projections on both sides of the shank part and a dovetail connected shank part, and the heat-resistant coating layer is provided on the surface off the blade part off at least one of the bucker and the nozzle.

The present invention relates to a combined power generating plane system provided with a gas turbine driven by a combustion gas flowing at a high speed, a waste heat recovering boiler for obtaining steam by combustion exhaust gas of from gas turbine, a steam turbine driven by the steam, and a generator driven by the gas turbine and the steam turbine, characterized in that the gas turbine has at lease three stages of buckets and nozzles, the temperature of the combustion gas at the inlet of the first stage of the bucket is 1300° C. or higher, the temperature of the combustion exhaust gas at the outlet of the gas turbine is 560° C. or higher, steam of 530° C. or higher is obtained by the waste heat recovering boiler, the steam is of high and low pressure integrated type, the steam temperature at the first stage off the bucket of the steam turbine is 530° C. or higher, the power generation capacity of the gas turbine is at least 50,000 KW and that of the steam turbine is at least 30,000 KW, overall thermal efficiency is at least 45%, the whole length of the first stage of the bucket is at least 200 mm, the first stage of the bucket has a blade part, a platform having flat portion connected to the blade part, a shank pare connected to the platform, a fin comprising projections provided on both sides of the shank part and a dovetail connected to the shank part, and the heat-resistant coating layer is provided on the surface of the blade part of at least one of the bucket and the nozzle.

According to the present invention, heat-resistant parts provided with a $ZrO_2$ ceramic coating layer which is a thermal stress relaxation type ceramic coating layer having various objects and actions and which comprises two layers of columnar texture and dense texture have been found by conducting high-temperature heat load tests under simulated severe heat load conditions of high operation temperatures on ceramics ($ZrO_2$ type) coating layers having various structures. Such $ZrO_2$ ceramic coating layer comprising two layers undergo greater thermal stress than a columnar texture type single layer having micro-cracks in the case of thickness being the same. However, by increasing the strength of the portion in the vicinity of starting point of breaking caused by thermal stress, it becomes possible to make the breaking to occur with difficulty and to inhibit the damages of the ceramic coating layer.

That is, according to the present invention, the portion which leads to the break starting point is positioned in the $ZrO_2$ coating layer by providing a $ZrO_2$ coating layer having dense texture under a columnar texture type $ZrO_2$ ceramic coating layer having micro-cracks. The coating layer having the construction of the present invention is high in strength because the starting point of breaking caused by thermal stress is in the $ZrO_2$ ceramic which is superior to $Al_2O_3$ in thermal shock resistance and which is dense. In addition, being different from a thin $Al_2O_3$ layer of several µm, the boundary portion with the alloy coating layer of low adhesiveness is not present in the vicinity of the head of microcracks. Therefore, the coating layer of the present invention can stand against larger heat load as compared with a single $ZrO_2$ coating layer having columnar texture structure and having micro-cracks.

Furthermore, the method for forming the $ZrO_2$ ceramic coating layer having two-layer structure of the present invention is also important. That is, as a method for controlling the texture of the $ZrO_2$ coating layer at the time of formation of film, the inventors have noticed a method of applying energy simultaneously with formation of the film in place of utilizing the temperature of base. In connection with energy source, as a result of conducting various investigations on matching with vapor deposition processes, it has been found that ion beam is most suitable as the energy source. The vapor deposition per se of $ZrO_2$ materials is a method of irradiating a base with ion beams utilizing the known electron beam vapor deposition. Ion beam is a high density energy source, but the energy is applied to only the uppermost surface portion of the irradiated material. Therefore, by simultaneously carrying out the ion beam irradiation and the vapor deposition, the resultant coating layer has columnar texture when energy of the ion beam is sufficiently great even when the layer is formed at a low base temperature.

This is due to the fact that the energy applied by irradiation of ion beam has the same effect as the preheating of base in the case of only vapor deposition. Moreover, according to the method of the present invention, between the $ZrO_2$ coating layer and the under layer, there can be formed a mixed layer comprising a mixture of the components of the respective layers by the implantation effect of irradiation with ion beam and an extremely excellent adhesiveness can be obtained. Accordingly, according to the method of the present invention, on an alloy coating layer having an $Al_2O_3$ layer of several µm thick on the surface is firstly formed the above-mentioned mixed layer by simultaneously carrying out irradiation of ion beam and vapor deposition of a $ZrO_2$ material. Thereafter, vapor deposition of $ZrO_2$ material is carried out with reducing the energy of ion beam or with an energy of 0 to form a $ZrO_2$ coating layer having a dense texture at a low base temperature.

Thereafter, by increasing the energy of ion beam and carrying out the ion beam irradiation and the vapor deposition of a $ZrO_2$ material in combination, energy is applied to only the portion in the vicinity of the above coating layer to form a $ZrO_2$ coating layer having columnar texture at a temperature of the base per se of 500° C. or lower. According to such method of the present invention, since the base temperature is low at the time of both the formation of the dense $ZrO_2$ coating layer and the formation of the $ZrO_2$ layer of columnar texture, cracks are not produced especially in the under dense $ZrO_2$ coating layer. Cracks in the longitudinal direction can be generated along the boundary of the columns in only the upper coating layer by subjecting the TBC having a coating layer of two-layer structure comprising different textures on the outermost surface to a heat treatment as an after-treatment.

In the TBC produced by the method of the present invention, the $ZrO_2$ coating layer has the action to relax the thermal stress and reliability of the material in the vicinity of the starting point of breaking induced by the thermal stress is high and consequently peeling caused by the breaking occurs with difficulty. In the above-mentioned method of the present invention, it is preferred to use oxygen ion as the ion beam. This is because when a $ZrO_2$ material is vapor deposited, $ZrO_{2-x}$ is formed with ease and thus the oxygen ion beam is preferred for obtaining $ZrO_2$ having nearly stoichiometric value. Furthermore, ion beams such as of $N_2$, Ar and the like may also be used without special problems. Moreover, the reason for using the ion beam is the rapid responsivity of energy by irradiation with ion beam in controlling the texture of $ZrO_2$ coating layer. That is, when the ion beam is put in the state of ON, the energy is immediately reflected on the film-forming state and when it is in the state of OFF or is made small, the energy immediately disappears. It is very difficult to realize such rapid responsivity by heating a large article such as a blade in vacuum.

The present invention is explained in more detail by the following examples.

EXAMPLE 1

A TBC having on the uppermost surface a $ZrO_2$ coating layer having two-layer structure was produced in the following manner as an example of the present invention and was examined on heat resistant characteristics thereof. As a base of a test piece, an Ni based super alloy (René-80: Ni-14% Cr-4% Mo-4% W-3% Al-5% Ti-9.5% Co) was used. On the surface of the base was formed a bonding layer using MCrAlY alloy (Co-32% Ni-21% Cr-8% Al-0.5% Y) powders by plasma spraying in a reduced pressure atmosphere. That is, the above alloy powders were introduced into a plasma jet (50 kW) formed using an Ar-7% $H_2$ mixed gas and sprayed, the pressure of the atmosphere during spraying being about 50 Torr. As a pretreatment before the formation of the bonding layer, the base was subjected to cleansing and degreasing and blasting with $Al_2O_3$ grits. The thickness of the thus formed bonding layer was 100 µm.

Thereafter, on the surface of the base of the test piece provided with the bonding layer was formed a $ZrO_2$ coating layer having two-layer structure of the present invention using a film forming apparatus having a vapor deposition source and an ion beam source. $ZrO_2$-6% $Y_2O_3$ was used as a material for the vapor deposition source and oxygen ion was used as the ion beam. The film formation was performed in the following manner. The surface of the bonding layer was irradiated with an oxygen ion beam (accelerating voltage: 10 keV) to carry out sputter cleaning of the surface of the bonding layer with oxygen ion and oxidation of the surface by oxygen ion implantation. In this case, the pressure in the film forming chamber was $10^{-5}$ Torr and the base temperature was about 50° C. As a result, the surface of the bonding layer was cleansed and at the same time, an $Al_2O_3$ layer of about 0.1 µm was formed thereon.

Thereafter, vapor deposition of $ZrO_2$-6% $Y_2O_3$ was carried out with continuing the oxygen ion irradiation. Output of the vapor deposition source was 10 kW and the vapor deposition was continued until the deposited film thickness reached about 0.5 µm measured by a monitor for film thickness with continuing the ion irradiation. In this case, the pressure in the film forming chamber was $5\times10^{-5}$ Torr and the base temperature was about 50° C. As a result, a mixed layer comprising a mixture of $Al_2O_3$ on the surface of the bonding layer and $ZrO_2$-6% $Y_2O_3$ of the vapor deposition material was formed. Thickness of this layer was about 0.1 µm as a result of analysis and a $ZrO_2$-6% $Y_2O_3$ coating layer of about 0.4 µm thick was formed thereon.

Thereafter, the irradiation of oxygen ion was discontinued and only the vapor deposition of $ZRO_2$-6% $Y_2O_3$ was carried out.

In this case, the pressure in the film forming chamber was $5 \times 10^{-5}$ Torr and the base temperature was about 100° C. As a result, a dense coating layer comprising $ZrO_2$-6% $Y_2O_3$ was formed and the thickness thereof was controlled to 20 µm by a monitor for film thickness. It should be noted that since the oxygen of $ZrO_2$ is easily removed from the crystal lattice of the $ZrO_2$, $ZrO_{2-x}$ can be used as a general representation showing that the oxygen content is deviated from the stoichiometric proportion $ZrO_2$. The value of x varies depending upon the conditions such as oxygen partial pressure and substrate temperature and can take different values in the range of from zero (0) to 2.0. Particularly in this example, the $ZrO_2$ layer formed under reduced pressure without irradiating oxygen ions contains approximately $ZrO_{1.8}$ (i.e., x is about 0.2).

Thereafter, the vapor deposition of $ZrO_2$-6% $Y_2O_3$ was continued and furthermore, the oxygen ion beam irradiation (accelerating voltage: 10 keV) was carried out, namely, the vapor deposition and the irradiation were carried out simultaneously. In this case, the pressure in the film forming chamber was $7 \times 10^{-5}$ Torr and the base temperature was about 150° C. The film formation was continued under this condition to form a coating layer of about 130 µm thick on said dense $ZrO_2$-6% $Y_2O_3$ coating layer. The $ZrO_2$-6% $Y_2O_3$ coating layer had a columnar texture and the size of each column constituting the columnar texture was 20–200 µm.

The reason for the columnar texture being formed is the irradiation of ion. By the energy of irradiated ion beam the columnar texture is formed through epitaxial growth also in the $ZrO_2$-6% $Y_2O_3$ which is a high-melting point material. The resulting TBC having the coating layers formed by the respective film forming processes mentioned above was subjected to a heat treatment as the next step to give a thermal stress to provide micro-cracks in the ceramic coating layer for the purposes of relaxing the thermal stress. The heat treatment was carried out at 1000° C. for 1 hour in the air.

As a result, cracks of 5–20 µm in width were formed along the boundaries of the columns and the columnar texture was divided into individual columns. These micro-cracks were not formed in the dense $ZrO_2$-6% $Y_2O_3$ coating layer under the columnar texture and stopped at the boundary portion between the columnar texture and the dense texture. Such state of the micro-cracks resulted due to the great difference in strength of the coating layers of the respective textures in the ceramic coating layer having the two-layer structure of the present invention.

FIG. 1 shows a schematic sectional view of the thus obtained TBC having the $ZrO_2$ coating layer of two-layer structure as the uppermost surface. FIG. 2 shows the result of observation of the surface by SEM. In FIG. 1, 1 indicates cracks, 2 a $ZrO_2$ ceramic having columnar texture, 3 a $ZrO_2$ ceramic having dense texture, 4 an $Al_2O_3$ layer, 5 a metal layer and 6 a base. In the TBC produced by the present invention, the $ZrO_2$ coating layer has a two-layer structure and the uppermost layer has a columnar texture which has open cracks of 5–20 µm in width at the boundaries between the columns of 20–200 µm. The under $ZrO_2$ coating layer has a dense texture and has no cracks. An $Al_2O_3$ layer is present under the dense $ZrO_2$ coating layer, a CoNiCrAlY alloy coating layer is present under the $Al_2O_3$ layer and an Ni based heat resisting alloy layer is present under the alloy coating layer. Furthermore, the SEM observation of the $ZrO_2$ coating layer revealed that it was comprised of secondary columnar crystals of 20–200 µm in diameter which were comprised of primary columnar crystals of 1–5 µm in size at boundaries of the secondary columnar crystals therebetween. This is shown in FIG. 2 (magnification: ×510). In FIG. 2, "A" denotes the columnar ceramic crystals and "B" the bonding layer.

FIGS. 3–6 are schematic sectional views of TBC of the present invention in which the $ZrO_2$-6% $Y_2O_3$ ceramic coating layer of two-layer structure was produced by the method of the present invention. In these FIGS. 3–6 the reference numerals 1–6 are the same as those in FIG. 1 and 7 indicates a mixed layer of ceramic and metal and 8 indicates a layer in which the composition changes from the metal to the ceramic. The TBC of the present invention shown in FIG. 3 was produced in the following manner. Mixed powders (mixing ratio 1/1) comprising Co-32% Ni-21% Cr-8% Al-0.5% Y and $ZrO_2$-6% $Y_2O_3$ were thermal sprayed on the pretreated Ni based heat resisting alloy (Rene' 80) in a reduced pressure atmosphere under the same conditions as mentioned above to form a coating layer of 100 µm thick. Thereafter, thereon was thermal sprayed Co-32% Ni-21% Cr-8% Al-0.5% Y in a reduced pressure atmosphere under the same conditions as mentioned above to form a coating layer of 50 µm thick. Thereafter, $Al_2O_3$ layer was formed thereon, a $ZrO_2$-6% $Y_2O_3$ coating layer having dense texture of 20 µm was formed on the $Al_2O_3$ layer and then a $ZrO_2$-6% $Y_2O_3$ coating layer having columnar texture of 130 µm was formed thereon in the same manner and under the same conditions as in Example 1, followed by heat treating in the same manner and under the same conditions as in Example 1. As a result, the uppermost $ZrO_2$-6% $Y_2O_3$ coating layer had a columnar texture of 20–200 µm in the size of columns and open cracks of 5–20 µm were formed at the boundaries of the columns.

The TBC of the present invention shown in FIG. 4 was produced in the same manner as in production of the TBC shown in FIG. 3 except that in the formation of the coating layer on the Ni based heat resisting alloy, first only the Co-32% Ni-21% Cr-8% Al-0.5% Y alloy powders were thermal sprayed and thereafter the amount of $ZrO_2$-6% $Y_2O_3$ powders was gradually increased to finally obtain a mixing ratio 1/1 of the alloy and the ceramic. The TBC of the present invention shown in FIG. 5 was produced by thermal spraying Co-32% Ni-21% Cr-8% Al-0.5% Y alloy powders on the surface of the Ni based heat resisting alloy in a reduced pressure atmosphere under the same conditions as in Example 1 to form a coating layer of 50 µm thick and thereafter forming the respective coating layers in the same manner as in the production of the TBC of FIG. 3. The TBC of the present invention shown in FIG. 6 was produced by thermal spraying Co-32% Ni-21% Cr-8% Al-0.5% Y alloy powders on the surface of the Ni based heat resisting alloy in a reduced pressure atmosphere under the same conditions as in Example 1 to form a coating layer of 50 µm thick and thereafter forming the respective coating layers in the same manner as in the production of the TBC of FIG. 4.

All of the TBC of the present invention shown in FIGS. 4–6 have on the uppermost surface a $ZrO_2$ceramic coating layer having columnar texture of 20–200 µm in the size of column in which open cracks of 5–20 µm are formed at the boundaries of the columns. The $ZrO_2$ceramic coating layer present thereunder has a dense texture and has no cracks. Test pieces having the TBC of the present invention shown in FIGS. 1–6 are shown in Table 1. The test pieces Nos. 1–9 show the TBC of the present invention shown in FIG. 1 in which the thickness of the $ZrO_2$ ceramic coating layer having columnar texture and that of the ZrO$_2$ ceramic coating layer having dense texture were changed. Test pieces Nos. 10–16 show the TBC of the present invention shown in FIGS. 3–6.

For comparison, the following TBC were further produced. FIG. 7 shows a TBC comprising a bonding layer and a ZrO$_2$ ceramic coating layer having a columnar texture between which an Al$_2$O$_3$ layer of about 2 μm thick was provided. This TBC was produced by thermal spraying Co-32% Ni-21% Cr-8% Al-0.5% Y alloy on the surface of a Ni based heat resisting alloy in a reduced pressure atmosphere to form a bonding layer of 100 μm thick and then vapor depositing thereon ZrO$_2$-6% Y$_2$O$_3$ to form a coating layer of 150 μm thick. The vapor deposition was carried out by an electron beam of 10 kW under the conditions of the pressure of 5×10$^{-5}$ Torr in the film forming chamber and the base temperature of 700° C. In this case, the resulting columnar texture comprised columns having a size of 50–200 μm and after the film formation by the vapor deposition, the film was heat treated at 1000° C. for 1 hour in the air to form open cracks of 1–5 μm at the boundaries of the columns. The cracks extended through the ceramic coating layer to reach the boundary between the ceramic coating layer and the bonding layer. Furthermore, an Al$_2$O$_3$ layer of 2 μm thick was formed on the surface of the bonding layer at the boundary portion between the ceramic coating layer and the bonding layer.

The test piece No. 17 was the thus obtained TBC and the test pieces Nos. 18 and 19 corresponded to the comparative TBC shown in FIG. 7 where the thickness of the ZrO$_2$ ceramic coating layer having columnar texture was changed. The TBC shown in FIG. 8 was also a TBC produced for comparison and this was produced by thermal spraying Co-32% Ni-21% Cr-8% Al-0.5% Y alloy powders on an Ni based heat resisting alloy in a reduced pressure atmosphere to form a coating layer of 100 μm thick and then forming a ZrO$_2$ ceramic coating layer of two-layer structure by vapor deposition, followed by carrying out a heat treatment. The vapor deposition was carried out in the following manner. A coating layer of 20 μm was formed using ZrO$_2$-6% Y$_2$O$_3$ as a starting material under the conditions of a pressure of 5×10$^{-5}$ Torr in the film forming chamber, a base temperature of 50° C. and an E.B. output of 10 kW and then further continuing the vapor deposition was further continued at a base temperature of 700° C. to form a coating layer of 130 μm. The reference numerals in FIGS. 7 and 8 are the same as in FIG. 1.

In this case, the ZrO$_2$ coating layer of 20 μm on the bonding layer had a dense texture and the ZrO$_2$ coating layer of 130 μm provided thereon had a columnar texture. Upon the heat treatment at 1000° C. for 1 hour, there were formed open cracks of 5–10 μm in width along the boundaries of columns having a size of 50–200 μm and these cracks extended through the ZrO$_2$ coating layer of dense texture to reach the boundary between the coating layer and the bonding layer. The heat treatment also resulted in an Al$_2$O$_3$ layer of 2 μm at the boundary portion between the ZrO$_2$ coating layer and the bonding layer. The test piece No. 20 was produced in this way.

TABLE 1

| Test piece No. | Thickness of ceramic layer having columnar texture (μm) | Thickness of ceramic layer having dense texture (μm) | Thickness of metal layer (μm) | Thickness of mixed layer (μm) | Thickness of metal layer (μm) |
|---|---|---|---|---|---|
| 1 | 130 | 20 | — | — | 100 |
| 2 | 90 | 60 | — | — | " |
| 3 | 320 | 20 | — | — | " |
| 4 | 75 | 75 | — | — | " |
| 5 | 150 | 10 | — | — | " |
| 6 | 70 | 5 | — | — | " |
| 7 | 300 | 20 | — | — | " |
| 8 | 370 | 30 | — | — | " |
| 9 | 370 | 40 | — | — | " |
| 10 | 130 | 20 | 50 | 100 | — |
| 11 | 200 | 50 | 50 | 100 | — |
| 12 | 130 | 20 | 50 | 100* | — |
| 13 | 130 | 20 | 50 | 100 | 50 |
| 14 | 200 | 50 | 50 | 100 | 50 |
| 15 | 130 | 20 | 50 | 100* | 50 |
| 16 | 200 | 50 | 50 | 100* | 50 |
| 17 | 150 | — | — | — | 100 |
| 18 | 200 | — | — | — | 100 |
| 19 | 300 | — | — | — | 100 |
| 20 | 130 | 20 | — | — | 100 |

*Composition of the mixed layer continuously changes from metal to ceramic.

Figure 9:
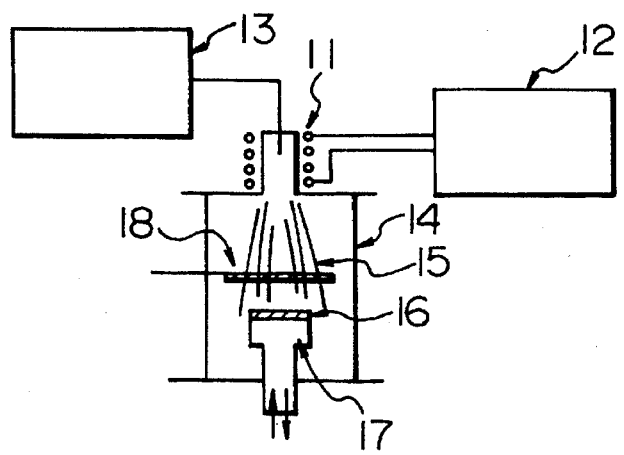
FIG. 9 is a showing of the construction of a high heat load heating tester.

The TBC of the present invention and the comparative TBC produced as mentioned above were subjected to heat load test on the supposition that they are to be used under high heat load conditions. FIG. 9 schematically shows the test method. The test comprised heating the surface of the test piece provided with the TBC using a high-frequency induction heat plasma as a heating source and simultaneously cooling the back side of the test piece. Thermocouples were embedded in the two portions of the test piece (Ni based heat resisting alloy) in the direction of thickness and heat flux which is a parameter of heat load was calculated. Moreover, temperature of the surface ZrO$_2$ ceramic coating layer of the TBC was measured by a radiation thermometer.

In this state, the switching shutter shown in FIG. 9 was operated to repeat heating, maintaining of the heating and cooling. The heat flux was measured under the maintaining of the heating. Furthermore, the output of high-frequency induction heat plasma was 10 kW and air was used as a plasma gas. The pressure in the container at the heating was 100 Torr. The size of the base of the test piece was 20 mm in diameter×3 mm in thickness and various TBC shown in Table 1 were provided on the surface of the base. The test results were judged by the state of damages of the TBC when exposed to the cycle repeatedly. The results are shown in Table 2.

In FIG. 9, 11 indicates a high-frequency induction coil, 12 a high-frequency electric source, 13 a gas source, 14 a a reactor, 15 a high-frequency induction heat plasma, 16 a test piece, 17 a water-cooled test piece holder and 18 a switching shutter.

TABLE 2

| Test piece No. | Heat load (Heat flux: MW/m²) | | | | | |
|---|---|---|---|---|---|---|
| | 0.5 | 0.8 | 1.0 | 1.5 | 3.0 | 4.5 |
| 1  | — | —  | o  | o   | o  | o |
| 2  | — | —  | "  | "   | "  | " |
| 3  | — | —  | "  | 33  | —  | — |
| 4  | — | o  | 52 | 19  | —  | — |
| 5  | — | —  | o  | o   | o  | o |
| 6  | — | o  | 76 | 44  | —  | — |
| 7  | — | —  | o  | —   | o  | o |
| 8  | — | —  | "  | —   | "  | o |
| 9  | — | —  | "  | 153 | —  | — |
| 10 | — | —  | "  | —   | "  | — |
| 11 | — | —  | "  | —   | "  | — |
| 12 | — | —  | "  | —   | "  | — |
| 13 | — | —  | "  | —   | "  | — |
| 14 | — | —  | "  | —   | "  | — |
| 15 | — | —  | "  | —   | "  | — |
| 16 | — | —  | "  | —   | "  | — |
| 17 | — | o  | 75 | 50  | 32 | 6 |
| 18 | o | 85 | 50 | 35  | 15 | — |
| 19 | o | 83 | 43 | 27  | 8  | — |
| 20 | — | o  | 82 | 45  | 14 | — |

In the test, repeated cycle test using heat flux as a parameter was conducted and when no damage occurred after repetition of 200 times, the sample was judged to be excellent in heat resistance (shown by O in Table 2). As shown in Table 2, even under the severe heat load environment of 3.0–4.5 MW/m², no damage was seen in the TBC having the $ZrO_2$ ceramic coating layer of two-layer structure of the present invention especially when the thickness of the dense $ZrO_2$ ceramic coating layer which was a lower layer was in the range of 10–60 µm. It can be considered that when the thickness of the dense ceramic layer is less than 10 µm, the mechanism breaking which starts at the head of the cracks generated at the boundaries of columns in the ceramic coating layer having columnar texture was the same as in the conventional TBC. The "—" means "not tested" and the numerals in this table represent a cycle number until the test piece was damaged.

It can be supposed that as a result, damages extended along the boundary between the $ZrO_2$ ceramic coating layer and the bonding layer (metal layer), resulting in the peeling of the layers. On the other hand, when the thickness was more than 60 µm, the dense $ZrO_2$ coating layer underwent great thermal stress and the coating layer was damaged under high heat load conditions, resulting in peeling of the layer. Thus, the thickness of the under $ZrO_2$ ceramic coating layer having dense texture in the $ZrO_2$ coating layer of two-layer structure is preferably in the range of 10–60 µm. Furthermore, the ratio of thickness (columnar texture)/(dense texture) in the coating layer of the present invention having the dense $ZrO_2$ ceramic coating layer having the thickness in the above range is also important and the ratio is preferably in the range of 1.5–15 and the total thickness of the columnar texture and the dense texture is preferably 400 µm or less.

Furthermore, it was also found that none of the TBC of the present invention shown in FIGS. 3–6 were damaged even under the large heat flux condition of 3 MW/m² and they had excellent heat resistance while the TBC made for comparison were damaged after subjected to less than 100 cycles under the heat flux condition of higher than 0.8–1.0 MW/m² and thus they were inferior in heat resistance.

In the TBC of the present invention, the thickness of the $ZrO_2$ ceramic coating layer having columnar texture has no special restriction, but the thickness of the ceramic coating layer has connection with heat barrier effect and the thicker the layer is, the greater the heat barrier effect is and the greater the heat flux is, the greater the heat barrier effect is. Under the great heat flux condition of 1–4.5 MW/m², a heat barrier effect of 90°–200° C. is obtained when the total thickness of the $ZrO_2$ ceramic coating layers having columnar texture and dense texture is about 300 µm. Accordingly, the thickness of the $ZrO_2$ ceramic coating layer having columnar texture which is the surface layer in the TBC of the present invention is desirably at most about 300 µm.

EXAMPLE 2

The test piece of No. 2 in Table 1 of Example 1 was produced using Co based alloy (FSX-414, Co-30% Cr-10% Ni-7% W-1% Mn-1% Si-0.2% C) as the heat resisting alloy in the same manner and under the same conditions as in Example 1 and was subjected to the heat load test shown in FIG. 9. As a result, it was found that even under the heat load condition of 4.5 MW/m² in heat flux the TBC of the present invention suffered no damages even after subjected to the repeated cycle test of 200 times and had heat resistance superior to that of the conventional TBC in Example 1.

EXAMPLE 3

The test piece of No. 1 in Table 1 of Example 1 was produced using Ni based unidirectional solidification material (DS material, Mar-M247, Ni-16% Cr-1.8% Mo-2.6% W-3.4% Al-3.4% Ti-1.7% Ta-8.5% Co-0.1% C) as the heat resisting alloy in the same manner and under the same conditions as in Example 1 and was subjected to the heat load test shown in FIG. 9. As a result, it was found that even under the heat load condition of 4.5 MW/m² in heat flux the TBC of the present invention suffered no damages even after subjected to the repeated cycle test of 200 times and had heat resistance superior to that of the conventional TBC in Example 1.

EXAMPLE 4

A test piece was produced using Ni based single crystal material (SC material, CMSX-4, Ni-6.6% Cr-0.6% Mo-6.4% W-3.0% Re-5.6% Al-1.0% Ti-6.5% Ta-9.6% Co) as the heat resisting alloy in the same manner and under the same conditions as in Example 1. In this case, Ni-20% Cr-8% Al-1% Y alloy was used as the alloy for bonding layer and $ZrO_2$-8% $Y_2O_3$ was used as the ceramic coating layer. The thickness of each layer of the TBC was the same as in the test piece No. 5 in Table 1. As a result of the heat load test shown in FIG. 9, it was found that even under the heat load condition of 4.5 MW/m² in heat flux the TBC of the present invention suffered no damages even after subjected to the repeated cycle test of 200 times and had heat resistance superior to that of the conventional TBC in Example 1.

EXAMPLE 5

Figure 10:
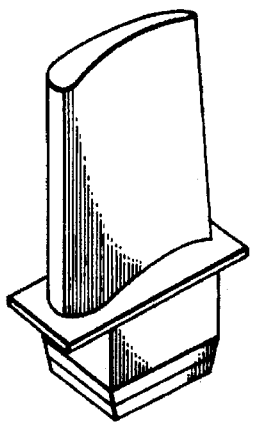
FIG. 10 is an oblique view of a ceramic coated bucket of a turbine.

A TBC bucket of the present invention comprising a turbine bucket (material: SC material, CMSX-4) shown in FIG. 10 provided with the TBC of the present invention on the blade surface and the platform part which are exposed to combustion gas was produced. The TBC was produced in the same manner as in Example 1 by first providing Ni-20% Cr-8% Al-1% Y alloy at a thickness of 100 µm as a bonding layer, then the $ZrO_2$ ceramic coating layer having a dense texture at a thickness of 30 µm and furthermore the $ZrO_2$ ceramic coating layer having a columnar texture at a thickness of 150 μm. Material of the ceramic layer was $ZrO_2$-8% $Y_2O_3$. Thereafter, the TBC was heated at 1100° C. for 4 hours as the heat treatment to form cracks of the similar size to those in Example 1 in the coating layer having columnar texture and simultaneously form an $Al_2O_3$ layer of 3 μm thick at the boundary between the $ZrO_2$ ceramic coating layer and the bonding layer.

Figure 11:
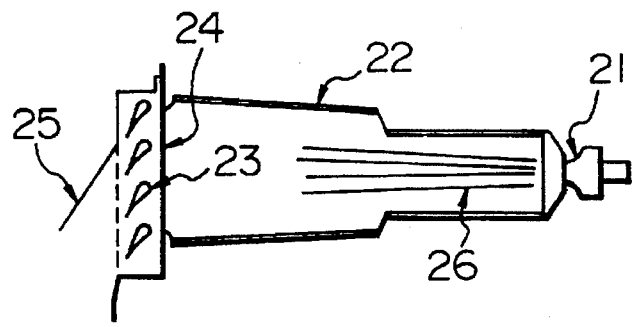
FIG. 11 is a showing of the construction of a heating tester simulated to real apparatus.

The thus produced turbine blade of the present invention was subjected to the heat load test by the heating tester shown in FIG. 11 which was simulated to the actual tester. In FIG. 11, 21 indicates a combustion nozzle, 22 a combustion cylinder, 23 a blade to be tested, 24 a blade-holder, 25 a heat removing duct and 26 a combustion flame. The test conditions were the combustion gas temperature: 1500° C. at maximum, the cooling air temperature: 170° C. and the pressure: 8 atom. In this test, the base temperature of the bucket having thermocouples previously embedded in the leading edge portion of the blade was measured in the state of heating being held and a heat flux of 3.2 MW/m² at maximum was obtained. For comparison, a bucket was produced by providing a $ZrO_2$ ceramic coating layer having columnar texture (180 μm) and a bonding layer (100 μm) in the same manner and under the same conditions as in production of the test piece No. 17 in Table 1 of Example 1. The materials of the coating layers were Ni-20% Cr-8% Al-1% Y and $ZrO_2$-8% $Y_2O_3$.

When the combustion gas temperature was 1000° C. (heat flux 0.8 MW/m²), both the turbine blade of the present invention and the comparative turbine blade suffered no damages in the TBC even after subjected to repetition of 10 times of the cycle consisting of starting, holding of steady state and stopping. However, when the combustion gas temperature was 1300° C. (heat flux 1.5 MW/m²), the turbine blade of the present invention was sound while the comparative turbine blade showed damages of peeling off of the ceramic coating layer at the leading edge portion after subjected to 10 cycles. Furthermore, when the combustion gas temperature was 1500° C. (heat flux 3.2 MW/m²), the turbine blade of the present invention was completely sound while the damage at the leading edge portion of the comparative turbine blade after subjected to 10 cycles increased than when the heating temperature was 1300° C.

EXAMPLE 6

Figure 12:
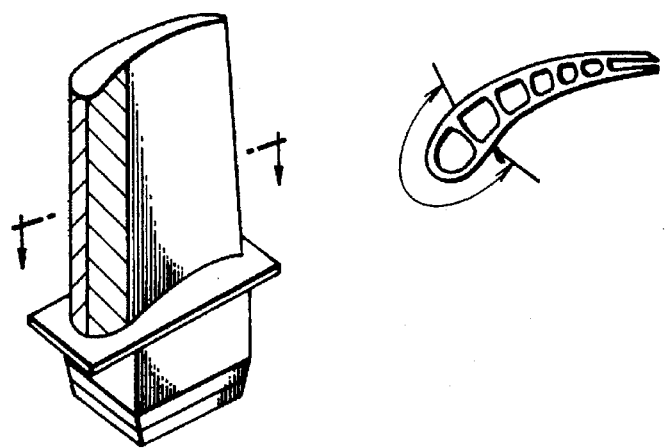
FIG. 12 is a sectional view of a ceramic coated bucket of a turbine.

A TBC bucket of the present invention comprising a turbine bucket (material: DS material, Mar-M-247) shown in FIG. 12 provided with the TBC of the present invention on the leading edge portion which is the portion exposed to combustion gas (the area shown by a—a in FIG. 12) was produced. This was produced in the same manner as in Example 5 by first providing Ni-30% Co-20% Cr-8% Al-0.5% Y alloy at a thickness of 50 μm as a bonding layer on the whole surface of the blade and the platform portion, then the $ZrO_2$ ceramic coating layer having a dense texture at a thickness of 20 μm on only the leading edge portion and furthermore the $ZrO_2$ ceramic coating layer having a columnar texture at a thickness of 130 μm on the whole surface of the blade and the platform portion. Material of the $ZrO_2$ ceramic was $ZrO_2$-6% $Y_2O_3$. In the TBC bucket of the present invention, the ceramic coating layer on the leading edge portion subjected to the severest heat load had two-layer structure and the other portion subjected to gentle heat load was provided with only the ceramic coating layer having columnar texture.

Figure 13:
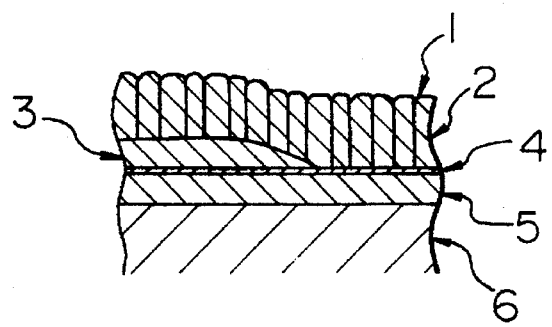
FIG. 13 is a schematic sectional view of a ceramic coating layer.

In this case, thickness of the ceramic coating layer on the leading edge of the blade was 150 μm and that of the coating layer on the abdomen side, the back side of the blade and the platform portion of the blade was 130 μm and the portion where the thickness differs continuously changes in thickness as shown in FIG. 13. For the TBC bucket of the present invention, oxygen ion irradiation was not carried out only in the formation of the dense coating layer of the leading edge portion and the oxygen ion irradiation was effected only in the formation of the coating layer having columnar texture. The irradiation conditions were the same as in Example 1. After the ceramic coating layer was provided on the whole surface, the same heat treatment as in Example 5 was conducted. The thus obtained TBC bucket of the present invention was subjected to the same heating test simulated to actual device and as a result, when the combustion gas temperature was 1500° C. (heat flux: 3.2 MW/m²), the TBC bucket of the present invention suffered no damages such as peeling and was sound.

EXAMPLE 7

Figure 14:
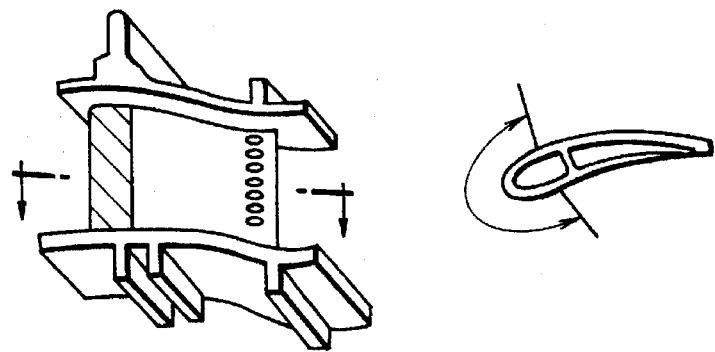
FIG. 14 is a sectional view of a ceramic coated nozzle of a turbine.

A TBC stationary blade of the present invention comprising a turbine bucket (material: Ni based heat resisting alloy IN-939, Ni-23% Cr-2% W-2% Al-3.7% Ti-1.4% Ta-19% Co-0.15% C) shown in FIG. 14 provided with the TBC of the present invention on the leading edge portion which is the portion exposed to combustion gas (the area shown by a—a in FIG. 14) was produced. This was produced in the same manner as in Example 5 by first providing Ni-25% Cr-10% Al-1.2% Y alloy at a thickness of 50 μm as a bonding layer on the whole surface of the blade and the upper and lower gas passing portions, then the ceramic coating layer having dense texture at a thickness of 30 μm and furthermore the ceramic coating layer having columnar texture at a thickness of 150 μm on only the leading edge portion of the blade in the same manner as in. Example 5. Thereafter, masking jigs of SUS were fitted to the leading edge portion having the ceramic coating layer and to the portion of film cooling hole and $ZrO_2$ ceramic coating layer was formed at a thickness of 180 μm on the abdomen side and back side of the blade and the platform portion by plasma spraying method.

In this case, the plasma forming gas was a mixed gas of Ar-10% $H_2$ and flow rate of the mixed gas was 45 liter/min and plasma output was 50 kW. The starting material was $ZrO_2$ ceramic powders of 10–44 μm and the powders were introduced into plasma jet in an amount of 55 g/min and the coating layer was formed at a spraying distance of 75–85 mm. In this way, the TBC was provided on the leading edge portion, the abdomen side, the back side and the platform portion and subjected to the heat treatment as in Example 5. The ceramic coating material was $ZrO_2$-8% $Y_2O_3$. The TBC stationary blade was subjected to the heating test simulated to actual device as in Example 5 and as a result, when the combustion gas temperature was 1500° C. (heat flux: 3.2 MW/m²), the TBC stationary blade of the present invention suffered no damages such as peeling and was sound.

EXAMPLE 8

A TBC having on the uppermost surface a hybridized columnar ceramic coating layer was produced and was examined on heat resistant characteristics thereof. As a base of a test piece, an Ni based super alloy (Rene'-80: Ni-14% Cr-4% Mo-4% W-3% Al-5% Ti-9.5% Co) was used- On the surface of the base was formed a bonding layer using an MCrAlY alloy (Co-32% Ni-21% Cr-8% Al-0.5% Y) powder by plasma spraying in a reduced pressure atmosphere. That is, the above alloy powder was introduced into a plasma jet (50 kW) formed using an Ar-7% $H_2$ mixed gas and sprayed, the pressure of the atmosphere during spraying being about 50 Torr. As a pretreatment before the formation of the bonding layer, the base was subjected to cleansing and degreasing and blasting with $Al_2O_3$ grits. Thickness of the thus formed bonding layer was 100 μm. Surface roughness of the bonding layer was Rmax 65 μm.

Thereafter, on the surface of the base of the Case piece provided with the bonding layer was formed The hybridized columnar ceramic coating layer of the present invention using a film forming apparatus having a vapor deposition source and an ion beam source. $ZrO_2$-6% $Y_2O_3$ was used as a material for the vapor deposition source and oxygen ion was used as the ion beam. The film formation was performed in the following manner. First, the surface of the bonding layer was irradiated with an oxygen ion beam (accelerating voltage: 10 keV) to carry out sputter cleaning of the surface of the bonding layer with oxygen ion and oxidation of the surface by oxygen ion implantation. In this case, the pressure in the film forming chamber was $10^{31\ 5}$ Torr and the base temperature was about 50° C. The base temperature was measured by providing a thermocouple on the back side of the base. As a result, the surface of the bonding layer was cleansed and at the same time, an $Al_2O_3$ layer of about 0.1 μm was formed thereon.

Thereafter, vapor deposition of $ZrO_2$-6% $Y_2O_3$ was carried out with continuing the oxygen ion irradiation. Output of the vapor deposition source was 10 kW and the vapor deposition was continued until the deposited film thickness reached about 0.5 μm measured by a monitor for film thickness with continuing the ion irradiation. In this case, the pressure in the film forming chamber was $5 \times 10^{-5}$ Torr and the base temperature was about 50° C. As a result, a mixed layer comprising a mixture of $Al_2O_3$ of the surface of the bonding layer and $ZrO_2$-6% $Y_2O_3$ of the vapor deposition material was formed. Thickness of this layer was about 0.1 μm as a result of analysis and a $ZrO_2$-6% $Y_2O_3$ coating layer of about 0.4 μm thick was present thereon.

Thereafter, irradiation of oxygen ion beam (accelerating voltage: 10 keV) was carried out with continuing the vapor deposition of $ZrO_2$-6% $Y_2O_3$ whereby the vapor deposition and the irradiation were simultaneously carried out. In this case, the pressure in the film forming chamber was $7 \times 10^{-5}$ Torr and the base Temperature was about 150° C. In this state, the film formation was continued to form a coating layer of about 150 μm on the above dense $ZrO_2$-6% $Y_2O_3$ coating layer. In this case, tile $ZrO_2$-6% $Y_2O_3$ coating layer comprised primary and secondary columnar textures and width of the columns constituting the primary columnar texture was 2–5 μm and width of the secondary texture comprising the primary columnar texture was 50–100 μm.

As the reason for the primary and secondary columnar textures being formed in this way, the ion irradiation can be referred to, and by the energy of the irradiated ion beam, the columnar texture is also obtained through epitaxial growth in $ZrO_2$-6% $Y_2O_3$ which is a high melting point material. The TBC having the coating layers formed by the above-mentioned film forming processes was subjected to the next step of beam treatment to apply thermal stress, thereby to form a tertiary columnar texture in the ceramic coating layer. The heat treatment was conducted at 1050° C. for 4 hours in the air.

As a result, cracks of 5–20 μm in width were formed along the boundaries of the secondary columnar textures in the $ZrO_2$-6% $Y_2O_3$ coating layer comprising the primary and secondary columnar textures and the columnar texture was divided into individual columns.

FIG. 15 shows a schematic cross-sectional view of the thus obtained TBC having the hybridized columnar ceramic coating layer on the uppermost surface. In FIG. 15, reference numerals 31, 32 and 33 indicate a primary, secondary and tertiary columnar textures, respectively, reference numeral 34 indicates a hybridized columnar ceramic layer comprising the columnar textures 31, 32 and 34, 35 micro-cracks, 36 an $Al_2O_3$ layer and 37 a metal layer 37 and 38 a base. The surface and the rupture section were observed by SEM. As is seen from FIG. 16, the observation of the rupture section by SEM was the same as chat of FIG. 2. In the TBC produced according to the present invention, the $ZrO_2$ ceramic coating layer comprises primary to tertiary columnar textures, and the secondary columnar texture has a width of 50–100 μm and is composed of aggregate of primary columnar textures having a width of 2–5 μm and the tertiary columnar texture is composed of one or an aggregate of a plurality of the secondary columns, the width of the cracks at the boundaries of the tertiary columns being 5–20 μm.

FIGS. 17–20 are schematic sectional views of TBC of the present invention in which a hybridized columnar ceramic coating layer was produced by the method of the present invention. Reference numerals 31–38 indicate the same things as in FIG. 15. Reference numeral 40 indicates a layer having a composition changing from a metal to a ceramic. TBC of the present invention shown in FIG, 17 was produced in the following manner. A mixed powder (mixing ratio 1/1) comprising Co-32% Ni-21% Cr-8% Al-0.5% Y and $ZrO_2$-6% $Y_2O_3$ was thermal sprayed on the pretreated Ni based heat resisting alloy (Rene' 80) in a reduced pressure atmosphere under the same conditions as above no form a coating layer of 100 μm thick. Thereafter, thereon was thermal sprayed Co-32% Ni-21% Cr-8% Al-0.5% Y in a reduced pressure atmosphere under the same conditions as above to form a coating layer of 50 μm thick. Thereafter, a hybridized columnar ceramic coating layer was produced in the same manner and under the same conditions as above. The ceramic was $ZrO_2$-6% $Y_2O_3$ and the thickness was the same as above. The texture of the resulting hybridized columnar ceramic coating layer was also the same as above.

Figure 18:
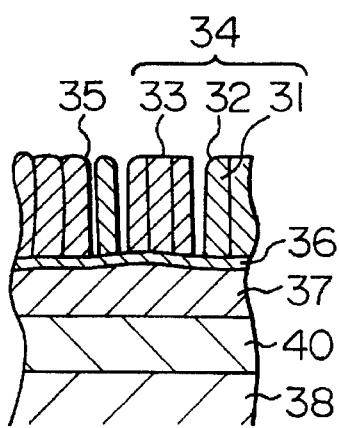
FIG. 18 is a schematic sectional view of a ceramic coating layer.
Figure 19:
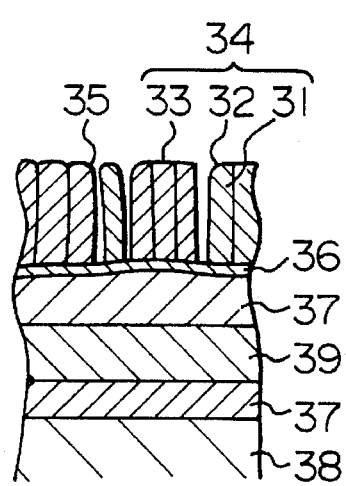
FIG. 19 is a schematic sectional view of a ceramic coating layer.

The TBC of the present invention shown in FIG. 18 was produced in the same manner as in production of the TBC shown FIG. 3 except that in the formation of the coating layer on the Ni based heat resisting alloy, first only the Co-32% Ni-21% Cr-8% Al-0.5% Y alloy powder was thermal sprayed and thereafter the amount of $ZrO_2$-6% $Y_2O_3$ powder was gradually increased no finally reach a mixing ratio 1/1 of the alloy and the ceramic. Thereafter, the TBC of the present invention was produced in the same manner as in the production of the TBC of FIG. 17. The TBC of the present invention shown in FIG. 19 was produced thermal straying of Co-32% Ni-21% Cl-8% Al-0.5% Y alloy powder on the surface of the Ni based heat resisting alloy in a reduced pressure atmosphere under the same conditions as above to form a coating layer of 50 μm thick and thereafter forming respective coating layers in the same manner as in the production of the TBC of FIG. 3. The TBC of the present invention shown in FIG. 20 was produced by thermal spraying of Co-32% Ni-21% Cr-8% Al-0.5% Y alloy powder on the surface of the Ni based heat resisting alloy in a reduced pressure atmosphere under the same conditions as above to form a coating layer of 50 μm thick and thereafter forming the respective coating layers in the same manner as in the production of the TBC of FIG.

Table 3 shows the test pieces provided with the TBC of the present invention shown in FIGS. 15–20.

TABLE 3

| | Thickness of ceramic layer (μm) | Thickness of metal layer (μm) | Thickness of mixed layer (μm) | Thickness of bonding metal layer (μm) |
|---|---|---|---|---|
| 21 | 150 | 100 | — | — |
| 22 | 100 | 100 | — | — |
| 23 | 300 | 130 | — | — |
| 24 | 400 | 150 | — | — |
| 25 | 500 | 150 | 100 | — |
| 26 | 150 | 50 | 100* | — |
| 27 | 150 | 50 | 100 | 50 |
| 28 | 150 | 50 | 100* | 50 |
| 29 | 150 | 50 | — | — |
| 30 | 150 | 100 | — | — |
| 31 | 100 | 100 | — | — |
| 32 | 200 | 130 | — | — |

*: The composition of the mixed layer continuously changes from the metal to the ceramic.

The test piece Nos. 21–25 had the TBC of the present invention shown in FIG. 15 where thickness of the $ZrO_2$ coating layer of columnar texture and that of the $ZrO_2$ coating layer of dense texture were changed variously. The test piece Nos. 26–29 show the TBC of the present invention shown in FIGS. 16–19.

Figure 20:
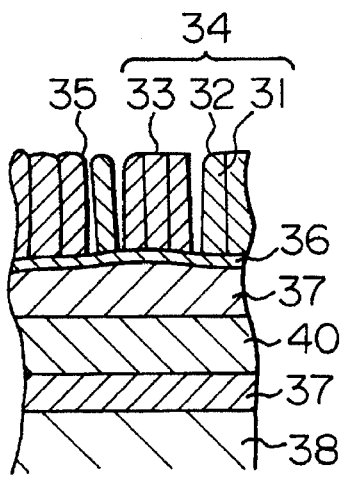
FIG. 20 is a schematic sectional view of a ceramic coating layer.
Figure 21:
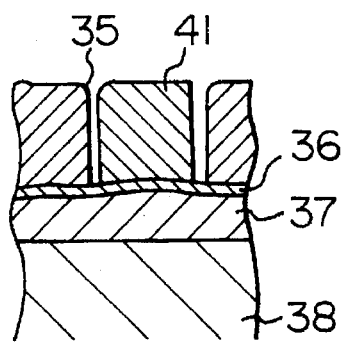
FIG. 21 is a schematic sectional view of a ceramic coating layer.

For comparison, the following TBC were further produced. FIG. 21 shows a TBC comprising a bonding layer and a $ZrO_2$ ceramic coating layer having a columnar texture between which an $Al_2O_3$ layer of about 2 μm thick was provided. In FIG. 20, the reference numerals indicate the same things as in FIGS. 17–20, and reference numeral 41 indicates a columnar ceramic layer. This TBC was produced by thermal spraying of Co-32% Ni-21% Cr-8% Al-0.5% Y alloy on the surface of a Ni based heat resisting alloy in a reduced pressure atmosphere to form a bonding layer of 100 μm thick, then abrading the surface of the bonding layer to a roughness of Rmax of 10 μm and thereafter, vapor depositing thereon $ZrO_2$-6% $Y_2O_3$ to form a coating layer of 50 μm thick. The vapor deposition was carried out by an electron beam of 10 kW under the conditions of the pressure of $5 \times 10^{-5}$ Torr in the film forming chamber and the base temperature of 900° C. In this case, the resulting columnar texture comprised columns (primary columns) having a size of 3–6 μm and after the film formation by the vapor deposition, the film was heat treated at 1050° C. for 4 hours in the air to form open cracks of 0.1–0.5 mm and the ceramic coating layer was divided by the cracks to a size of 0.5–1 mm.

The test piece No. 30 was a TBC produced in this way and the test pieces Nos. 31 and 32 were the comparative TBC of FIG. 20 where thickness of the $ZrO_2$ ceramic coating layer was changed.

The TBC of the present invention and the comparative TBC produced as mentioned above were subjected to heat load test on the supposition that they are to be used under high hear load conditions in the same manner as in FIG. 9. The results are shown in Table 4.

TABLE 4

| Test piece No. | Heat load (Heat flux: MW/m²) | | | | | | |
|---|---|---|---|---|---|---|---|
| | 0.5 | 0.8 | 1.0 | 1.5 | 2.0 | 3.0 | 4.5 |
| 21 | o | o | o | o | o | o | o |
| 22 | — | — | o | o | o | o | o |
| 23 | — | — | o | o | — | o | o |
| 24 | — | — | o | o | o | 250 | — |
| 25 | — | — | o | o | 230 | — | — |
| 26 | — | — | o | — | — | o | o |
| 27 | — | — | o | — | — | o | o |
| 28 | — | — | o | — | — | o | o |
| 29 | — | — | o | — | — | o | o |
| 30 | o | o | 75 | 50 | — | 32 | — |
| 31 | o | o | 85 | 50 | — | 25 | — |
| 32 | o | 85 | 50 | 35 | — | 15 | — |

In the test, a repeated cycle test using heat flux as a parameter was conducted and when no damage occurred after repetition of 300 times, the sample was judged to be excellent in heat resistance (shown by "O" in Table 4). As shown in Table 4, even under the severe heat load environment of 3.0–4.5 MW/m², no damage was seen in the TBC having the hybridized columnar ceramic coating layer of the present invention.

Furthermore, it was also found that none of the TBC of the present invention shown in FIGS. 17–20 were damaged even under the large heat flux condition of 3 MW/m² and they had excellent heat resistance. On the other hand, the TBC made for comparison were damaged after subjected to less than 100 cycles under the heat flux condition of higher than 0.8–1.0 MW/m² and thus they were inferior in heat resistance.

In the TBC of the present invention, the thickness of the $ZrO_2$ ceramic coating layer, having columnar texture has no special restriction, but the thickness of the ceramic coating layer has connection with heat barrier effect and the thicker the layer is, the greater the heat barrier effect is and the greater the hear flux is, the greater the heat barrier effect is. Under the great hear flux condition of 1–4.5 MW/m², a heat barrier effect of 90°–200° C. is obtained when the thickness of the hybridized ceramic coating layer is about 300 μm. Accordingly, the thickness of the $ZrO_2$ ceramic coating layer having the hybridized columnar texture in the TBC off the presenter invention is desirably at most about 300 μm.

EXAMPLE 9

The test piece of No. 22 in Table 3 of Example 8 was produced using a Co based alloy (FSX-414, Co-30% Cr-10% Ni-7% W-Mn-1% Si-0.2% C) as the heat resisting alloy in the same manner and under the same conditions as in Example 8 and was subjected to the heat load test shown in FIG. 9. As a result, it was found that even under the heat load condition of 4.5 MW/m² in heat flux the TBC of the present invention suffered no damages even after subjected to the repeated cycle test of 300 times and had heat resistance superior to that of the conventional TBC in Example 8.

EXAMPLE 10

The test piece of No. 1 in Table 1 of Example 1 was produced using Ni based unidirectional solidification material (DS material, Mar-M247, Ni-16% Cr-1.8% Mo-2.6% W-3.4% Al-3.4% Ti-1.7% Ta-8.5% Co-0.1% C) as the heat resisting alloy in the same manner and under the same conditions as in Example 1 and was subjected to the heat load test shown in FIG. 9. As a result, it was found that even under the heat load condition of 4.5 MW/m² in heat flux the TBC of the present invention suffered no damages even after subjected to the repeated cycle test of 300 times and was sound, and had heat resistance superior to that of the conventional TBC in Example 8.

EXAMPLE 11

A test piece was produced using Ni based single crystal material (SC material, CMSX-4, Ni-6.6% Cr-0.6% Mo-6.4% W-3.0% Re-5.6% Al-1.0% Ti-6.5% Ta-9.6% Co) as the heat resisting alloy in the same manner and under the same conditions as in Example 1. In this case, Ni-20% Cr-8% Al-1% Y alloy was used as the allow for bonding layer and $ZrO_2$-8% $Y_2O_3$ was used as the ceramic coating layer. The thickness of each layer of the TBC was the same as in the test piece No. 21 in Table 1. As a result of the heat load test shown in FIG. 9, it was found that even under the heat load condition of 4–5 MW/m² in heat flux the TBC of the present invention suffered no damages even after subjected to the repeated cycle test of 300 times and was sound, and had heat resistance superior to that of the conventional TBC in Example 8.

EXAMPLE 12

A TBC bucket of the present invention comprising a turbine bucket (material: SC material, CMSX-4) shown in FIG. 10 provided with the TBC of the present invention on the blade surface and the platform part which are exposed to combustion gas was produced. The TBC was produced in the same manner as in Example 1 by first providing Ni-20% Cr-8% Al-1% Y alloy at a thickness of 100 µm as a bonding layer and then a $ZrO_2$ ceramic coating layer having primary and secondary hybridized columnar textures at a thickness of 150 µm. The material of the ceramic coating layer was $ZrO_2$-8% $Y_2O_3$. Thereafter, the TBC was heated at 1100° C. for 4 hours as the heat treatment to form a coating layer of tertiary columnar texture comrising one secondary column and a plurality of secondary columns.

The thus produced turbine blade of the present invention was subjected to the heat load test by the heating tester shown in FIG. 11 which was simulated to the actual tester. The test conditions were the combustion gas temperature: 1500° C. at maximum, the cooling air temperature: 170° C. and the pressure: 8 atm. In this test, the base temperature of the bucket having thermocouples previously embedded in the leading edge portion of the blade was measured in the state of heating being held and a heat flux of 3.2 MW/m² at maximum was obtained. For comparison, a bucket was produced by providing a ceramic coating layer (150 µm) having columnar texture of 3–6 µm in width and a bonding layer (100 µm) in the same manner and under the same conditions as in production of the test piece No. 30 in Table 3 of Example 8. The materials of the coating layers were Ni-20% Cr-8% Al-7% Y and $ZrO_2$-8% $Y_2O_3$.

When the combustion gas temperature was 1000° C. (heat flux 0.8 MW/m²), both the turbine blade of the present invention and the comparative turbine blade suffered no damages in the even after subjected to repetition of 10 times of the cycle consisting of starting, holding of steady state and stopping. However, when the combustion gas temperature was 1300° C. (heat flux 1.5 MW/m²), the turbine blade of the present invention was sound while the comparative turbine blade showed damages of the peeling off of the ceramic coating layer at the leading edge portion after subjected to 10 cycles. Furthermore, when the combustion gas temperature was 1500° C. (heat flux 3.2 MW/m²), the turbine blade of the present invention was completely sound while the damage at the leading edge portion of the comparative turbine blade after subjected to 10 cycles increased than when the heating temperature was 7300° C.

EXAMPLE 13

A TBC bucket of the present invention comprising a turbine bucker (material: DS material, Mar-M-247) shown in FIG. 12 provided with the TBC of the present invention on the leading adge portion which is the portion exposed to combustion gas (the area shown by a—a in FIG. 12) was produced. This was produced in the same manner as in Example 5 by first providing Ni-30% Co-20% Cr-8% Al-0.5% Y alloy at a thickness of 50 µm as a bonding layer on the whole suface of the blade and the platform portion and then the $ZrO_2$ ceramic coating layer having the hybridized columnar texture at a thickness of 200 µm on only the leading edge portion. $ZrO_2$-8% $Y_2O_3$ was spray coated on other surface of the blade and platform portion other than the leading edge portion to form a coating layer of 200 µm thick.

In this case, the plasma forming gas was a mixed gas of Ar-10% $H_2$ and flow rate of the mixed gas was 45 liters/min and plasma output was 50 kW. The starting material was $ZrO_2$ ceramic powder of 10–44 µm and the powder was introduced into plasma jet in an amount of 55 g/min and the coating layer was formed at a spraying distance of 75–85 mm.

After providing the ceramic layer on the whole surface, the bucket was subjected to the same heat treatment as in Example 12. The thus produced TBC bucket of the present invention was subjected to the heating test simulated to actual device as in Example 12 and as a result, when the combustion gas temperature was 1500° C. (heat flux: 3.2 MW/m²), the TBC bucket of the present invention suffered no damages such as peeling and was completely sound.

EXAMPLE 14

A TBC nozzle of the present invention comprising a turbine nozzle (material: Ni based heat resisting alloy IN-939, Ni-23% Cr-2% W-2% Al-3.7% Ti-1.4% Ta-19% Co-0.15% C) shown in FIG. 14 provided with the TBC of the present invention on the leading edge portion which is the portion exposed to combustion gas (the area shown by a—a in FIG. 14) was produced. This was produced in the same manner as in Example 5 by first providing Ni-25% Cr-10% Al-1.2% Y alloy at a thickness of 50 µm as a bonding layer on the whole suface of the blade and the upper and lower gas passing portions and then the ceramic coating layer having the hybridized columnar texture at a thickness of 150 µm on only the leading edge portion of the blade in the same manner as in Example 5. Thereafter, masking jigs of SUS were fitted to the leading edge portion having the ceramic coating layer and to portion of film cooling hole and $ZrO_2$ ceramic coating layer was formed at a thickness of 180 µm on the abdomen side and back side of the blade and the platform portion by plasma spraying method.

In this case, the plasma forming gas was a mixed gas of Ar-10% $H_2$ and flow rate of the mixed gas was 45 liters/min and plasma output was 50 kW. The starting material was $ZrO_2$ ceramic powder of 10–44 µm and the powder was introduced into plasma jet in an amount of 55 g/min and the coating layer was formed at a spraying distance of 75–85 mm. In this way, the TBC nozzle was provided on the leading edge portion, the abdomen side, the back side and the platform portion and subjected to the heat treatment as in Example 12. The ceramic coating material of the TBC nozzle of the present invention was $ZrO_2$-8% $Y_2O_3$. The TBC nozzle was subjected to the heating test simulated to actual device as in Example 12 and as a result, when the combustion gas temperature was 1500° C. (heat flux: 3.2 MW/m$^2$), the TBC nozzle of the present invention suffered no damages such as peeling and was sound.

EXAMPLE 15

Figure 22:
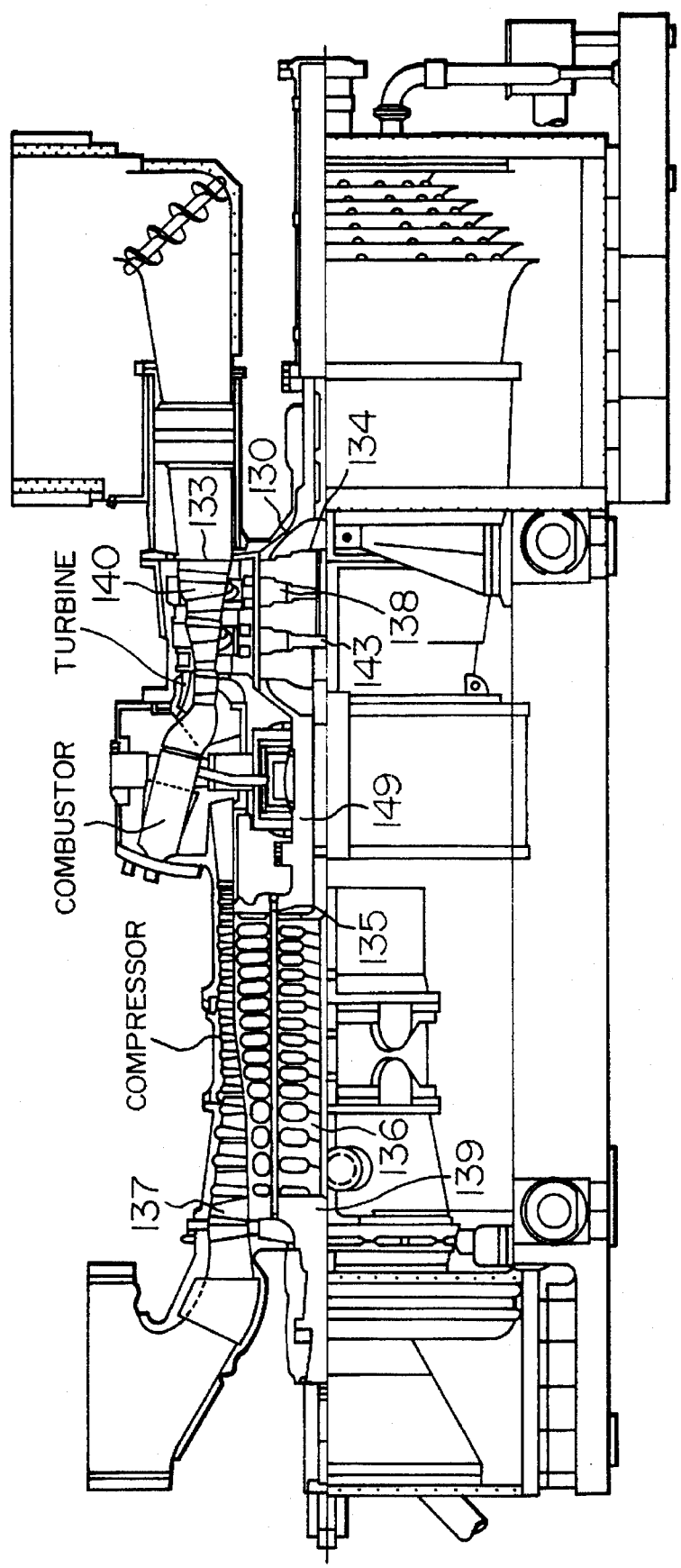
FIG. 22 is a general view of a gas turbine according to the present invention.
Figure 23:
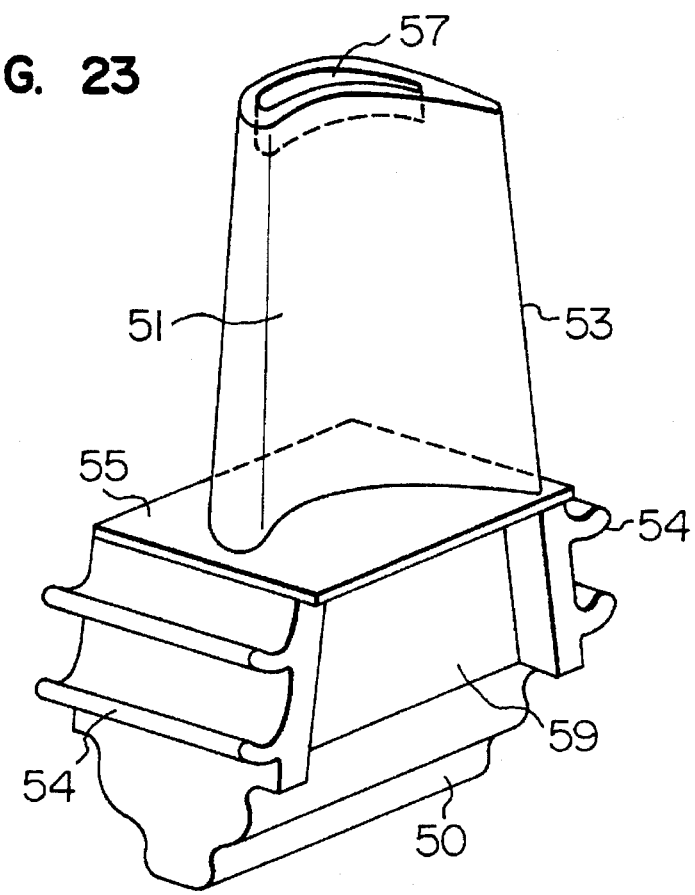
FIG. 23 is an oblique view of a gas turbine bucket according to the present invention.
Figure 24:
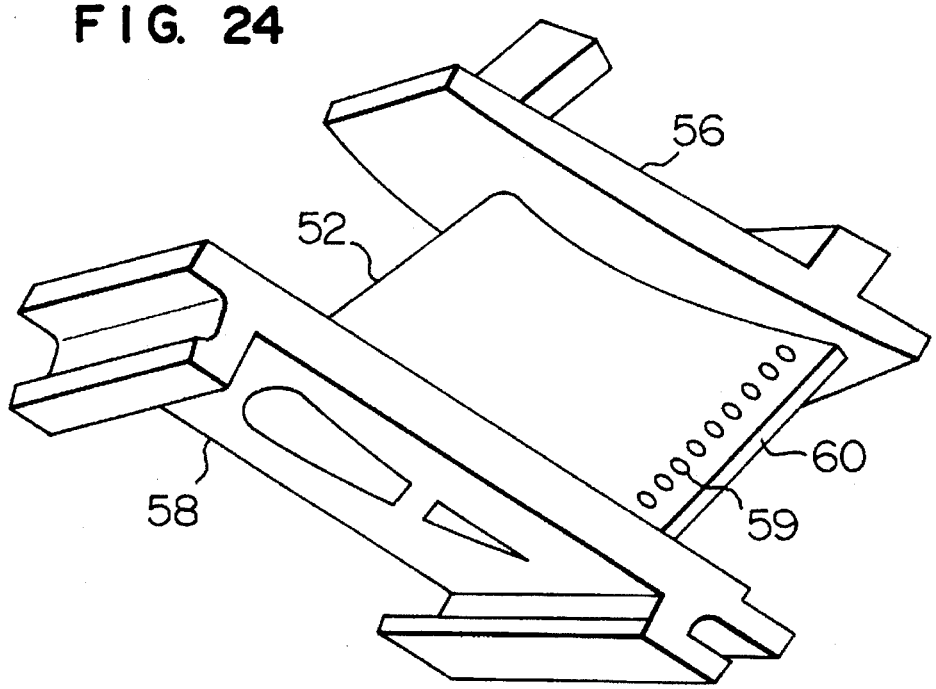
FIG. 24 is an oblique view of a gas turbine nozzle according to the present invention.

FIG. 22 is a sectional view of a gas turbine having a gas turbine bucket and a nozzle on which a heat-resistant coating layer was formed by the method of Example 8. FIG. 23 shows a structure of a specific bucket and FIG. 24 shows a structure of a specific nozzle. The alloy described in Example 8 was used for the bucket and the alloy described in Example 14 was used for the nozzle.

The bucket of FIG. 23 has dovetail 50 in conformity with planting on the disk, blade part 57, shank 59, platform 55 and seal fin 54, and 53 indicates a trailing part and 57 indicates a concave part.

The nozzle has blade part 52, sidewall inner circumference 56 and outer circumference 58. The gas turbine nozzle and the blade were prepared in the following manner. A wax model having the shame as shown in FIG. 24 was dipped in a solution of an acrylic resin in methyl ethyl ketone, air dried, then dipped in a slurry (zircon flour+colloidal silica+alcohol), and sprayed with a stack (the first layer: zircon sand and the second and following layers: chamotte sand). This was repeated some times to form a mold. The resulting mold was dewaxed and fired at 900° C. Then, this mold was placed in a vacuum furnace and the alloy molten by vacuum melting was cast in the mold in vacuum. The nozzle had a width of the blade part between the sidewalls of about 74 mm, a length of the blade part of 110 mm, a thickness at maximum of 25 mm and a sectional thickness of 3–4 mm, and was provided with seal fin cooling holes 59 and slit 60 for air passage having a width of about 0.7 mm at the tip portion.

The blade had a length of blade part of 100 mm and a length of 120 mm after the platform. The blade of this example was provided with cooling holes from the dovetail part through the blade part so as to pass a cooling medium, especially air or steam so that the blade can be internally cooled. Furthermore, at the trailing edge part a slit-like discharge hole for the cooling medium was provided.

The nozzle was provided with holes for pin fen cooling, impingement cooling and film cooling. The wall thickness of the slit part at the tip was about 1 mm. The nozzle was subjected to solution treatment and aging treatment in a non-oxidizing atmosphere.

The blade and nozzle in this example are formed most suitably in one stage, but can be in two and three stages. Especially, for nozzle, nozzles comprising one blade pare made of a Co based alloy are provided at the second and third stages. The one stage nozzle is constrained at both ends while the second and third stages are constrained at one side. The second stage and the third stage are greater in the width of the blade part than the first stage.

An SUS 304 stainless steel pipe having impingement cooling holes was TIG welded overall the periphery of the main body, from which cooling air is introduced and air is prevented from leaking from the welded portion. Holes from which air comes out are also provided at the inside of the outlet of combustion gas. The one stage nozzle has the construction of being constrained at both ends of the sidewall, but the second stage and following have the construction of being constrained at one end of the sidewall outer periphery.

In the nozzle comprising an Ni based alloy in this example, γ' phase is precipitated in γ phase matrix.

In FIG. 22, reference numeral 130 indicates a turbine stub shaft, 133 indicates a turbine bucket, 143 indicates a turbine stacking bolt, 138 indicates a turbine spacer, 149 indicates a distance piece, 140 indicates a nozzle, 136 indicates a compressor disk, 137 indicates a compressor blade, 138 indicates a compressor stacking bolt, 139 indicates a compressor stub shaft, 134 indicates a turbine disk. The gas turbine of the present invention has 17 stages of the compressor disks 136 and three stages of turbine buckets 133. The turbine bucket 133 may be of four stages and the present invention can be applied to any of them. Furthermore, reference numeral 143 indicates a turbine stacking bolt and 149 indicates a distance piece.

The gas turbine of this example is primarily of a heavy-duty type, single-shaft type, horizontally divided casing type or stacking type rotor. The compressor is a 17-stage axial flow type, the turbine is a three stage impulse type, and has a nozzle by 1 or 2 stage air cooling, the combustor is a pass flow type and has 16 cans and slot cooling system.

Distance piece 139, turbine disk 134, spacer 138 and compressor stacking bolt 135 are made of a fully tempered martensite steel comprising 0.06–0.15% of C, 1% or less of Si, 1.5% or less of Mn, 9.5–12.5% of Cr, 1.5–2.5% of Ni, 1.5–3.0% of Mo, 0.1–0.3% of V, 0.03–0.15% of Nb, 0.04–0.15% of N and the balance of Fe. The characteristics obtained in this example were a tensile strength of 90–120 kg/mm$^2$, a 0.2% proof strength of 70–90 kg/mm$^2$, an elongation of 10–25%, an area reduction of 50–70%, a V-notch impact strength of 5–9.5 kg-m/cm$^2$, and a creep rupture strength of 45–55 kg/mm$^2$ under conditions of 450° C. and $10^5$ h.

The turbine bucket 133 had three stages and the TBC produced in Example 8 was used for the first stage and the compression pressure of the compressor was 14.7, the temperature was 400° C., the inlet temperature of the first stage bucket was 1300° C., and the combustion gas temperature by the combstor was about 1450° C. The second stage of the turbine bucket 133 was a bucket of 280 mm in length (the blade part: 160 mm and the platform part and the following: 120 mm) having the same alloy composition as above and the third stage was a solid bucket of 350 mm in length (the blade part: 230 mm and the other part: 120 mm) having the same alloy composition as above. The production was carried out by precision casting of lost wax process.

The above-mentioned Ni based alloy was used for the first stage of the turbine nozzle and a known Co based alloy was used for the second and third stages and the first to third stages comprising one blade part were produced by precision casting. The length of the blade part corresponds to the length of the bucket and the blade part has the construction for pin fin cooling, impingement cooling and film cooling. The first stage nozzle was constrained at both sides of the sidewall and the second and third stages were constrained at one side of outer sidewall. The gas turbine was provided with an intercooler.

The power output obtained in this example was 50 MW and a thermal efficiency was higher than 33%.

Figure 25:
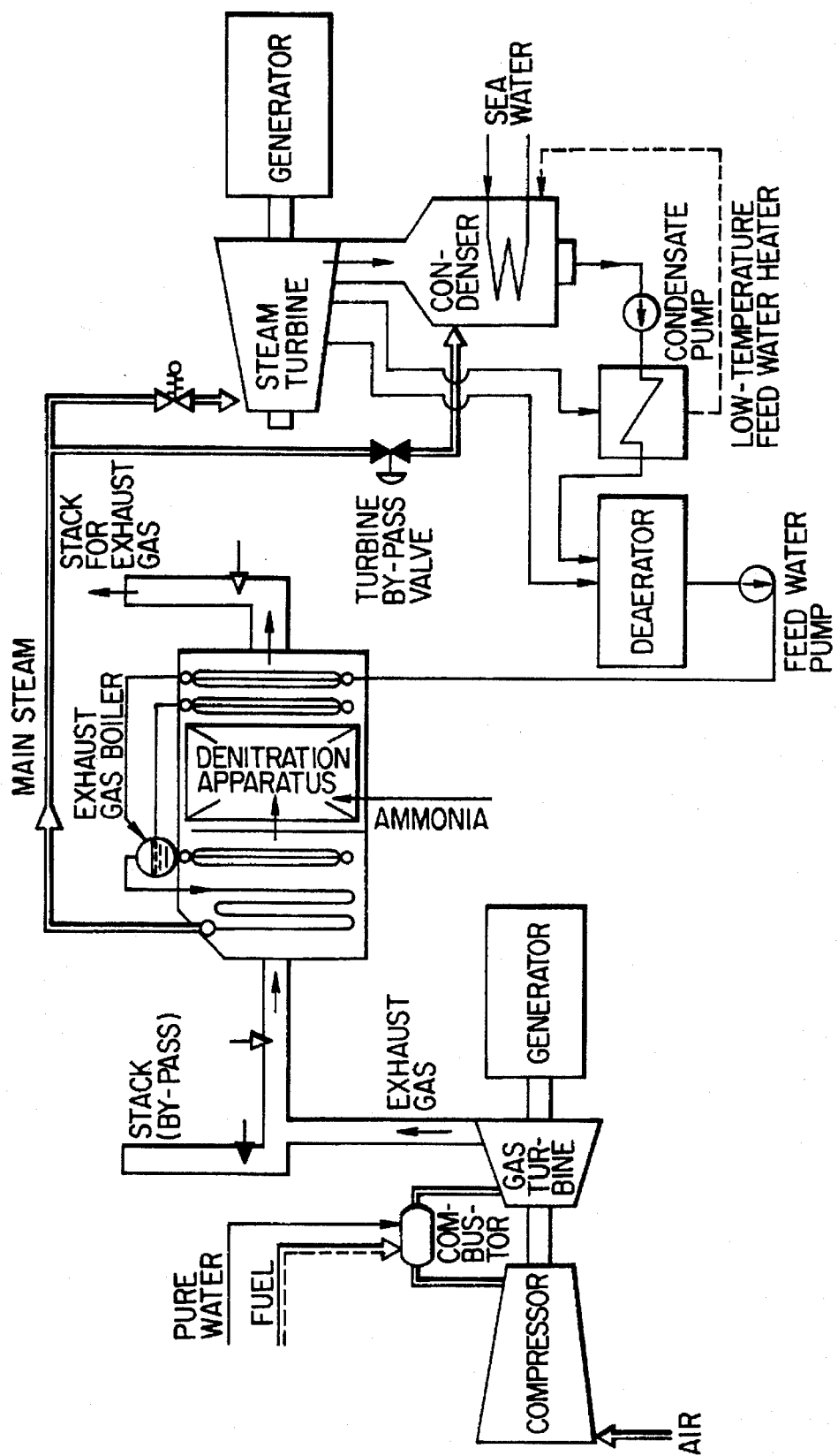
FIG. 25 is a general view of a combined power generating plant according to the present invention.

FIG. 25 is a diagram which shows a single-shaft combined cycle power generating system in which the gas turbine of Example 15 is used in combination with a steam turbine.

When power generation is carried out utilizing a gas turbine, recently, there is the tendency to employ a so-called combined power generating system according to which the gas turbine is driven using liquefied natural gas (LNG) as a fuel and the steam turbine is driven using steam obtained by recovering the exhaust gas energy of the gas turbine and a generator is driven by the steam turbine and the gas turbine. By employing the following system construction in this combined power generating system, high thermal efficiency of higher than about 45% can be obtained as compared with 40% in the case of using the conventional steam turbine alone. In such combined power generating plant, recently, it is attempted to use liquefied natural gas (LNG) and liquefied petroleum gas (LPG) in combination in place of LNG alone thereby to smoothen the operation of plants and improve economic efficiency.

First, air enters an air compressor of the gas turbine through an air filter and an air siren and the air compressor compresses the air and supplies the compressed air to a low NOx combustor. In the combustor, a fuel is jetted into the compressed air to perform combustion to produce a high-temperature gas of higher than 1400° C. and this high-temperature gas works in the turbine to generate a power.

The exhaust gas of higher than 530° C. discharged from the turbine is fed to a waste heat recovering boiler through an exhaust silencer and recovers the heat energy in the exhaust gas from the gas turbine to generate a high-pressure steam of higher than 530° C. In this boiler, there is provided a denitration apparatus which carries out dry ammonia catalytic reduction. The exhaust gas is discharged from a tripod concentric stack of several hundred meters in height. The generated high pressure and low pressure steams are fed to the steam turbine comprising a high and low pressure integrated rotor.

Furthermore, the steam which has left the steam turbine is introduced into a condenser, where the steam is vacuum deaerated to become a condensate and the condensate is pressurized by a condensate pump to become a feed water, which is fed to the boiler. The gas turbine and the steam turbine respectively drive the generators from the shaft-end thereof perform generation of power. For cooling of the blades of the gas turbine used for such combined power generation, the steam utilized for the steam turbine can sometimes be used as the cooling medium in addition to air. In general, air is used as a cooling medium for blades, but steam is considerably greater specific heat than air and light in weight and thus is high in cooling efficiency.

By using this combined power generating system, power of 50,000 kW can be obtained by the gas turbine and 30,000 kW can be obtained by the steam turbine, and thus 80,000 kW in total can be obtained. Since the steam turbine in this example is compact, it can be economically produced as compared with a large steam turbine for the same power generating capacity and can be economically operated for change in power generating quantity.

When the steam turbine of the present invention high and low pressure integrated steam turbine and the steam pressure at the inlet for main steam of this high and low pressure integrated steam turbine is 100 atg. and the temperature is raised to 538° C., output of the single turbine can be attained. In order to increase the output of single turbine, it is necessary to increase the blade length of the final stage bucket to more than 30 inches to increase steam flow rate.

The steam turbine of the present invention is provided with 13 or more stages of blades planted at the high and low pressure integrated type rotor shaft and the steam is introduced at high temperature and high pressure of 538° C. and 88 atg. from the steam inlet through a steam control valve. The steam flows in one direction from the inlet and discharged at 33° C. and 722 mmHg from the outlet of the final stage blade. The high end low pressure integrated type rotor shaft of the present invention is made of a forged steel of Ni-Cr-Mo-V low alloy steel. The portion of the rotor shaft at which blades are planted is in the form of a disk and is produced by integrally cutting from the shaft. The length of the disk part is longer with decrease in the length of the blade to decrease vibration.

The high and low pressure integrated type rotor shaft of this example comprises 0.18–0.30% C, 0.1% Si or less, 0.3% or less Mn, 1.0–2.0% Ni, 1.0–1.7% Cr, 1.0–2.0% Mo, 0.20–0.3% V and the balance of Fe and is hardened at 900°–1050° C. by water spray cooling and tempered at 650°–680° C.

The construction of the plant may be e single-axial arrangement of six power generating systems, each of which comprises a gas turbine, waste heat recovering boiler, steam turbine and generator, or a multi-axial arrangement of six systems each of which comprises a gas turbine end generator, a steam turbine, the steam of which is obtained by the exhaust gas of the six systems, and a generator.

The combined power generation comprises the combination of a gas turbine which is short in starting and stopping and is easy to operate and a steam turbine which is small and simple and therefore, adjustment of output is easy and this power generation is optimum as a middle load thermal power which meets the change in demands.

Reliability of gas turbine has markedly enhanced due to the recent technical development and furthermore, in the combined power generating plants, since the system is composed of combination of equipments of small capacity, even if some troubles occur, the influence can be limited to a part and thus, it is a power source of high reliability.

The ceramic coating layer of the present invention has two-layer structure comprising a ceramic layer of columnar texture having thermal stress relaxing action and a ceramic layer of dense texture having no cracks which become starting points of breaking induced by the thermal stress. Therefore, when it is used under the condition of a great temperature gradient occurring in the ceramic coating layer, namely, under a great heat flux condition, for example, when it is used for high-performance cooling blades as turbine parts in the case of high combustion gas temperature, the ceramic coating layer hardly suffers damages such as peeling because of the high endurance and the thermal barrier effect which is an inherent object to provide the layer can be sufficiently maintained and the reliability of the parts is improved by the reduction of the temperature of the substrate metal which constitutes the parts and the life of the pares can be prolonged. Furthermore, since the thermal barrier effect can be obtained stably, the amount of air for cooling the blades of gas turbines can be reduced and efficiency of power generation by turbines can be enhanced.

Furthermore, since the hybridized ceramic coating layer of the present invention is composed of the ceramics of primary to tertiary columnar textures differing in their size, when it is used as e heat barrier coating, the ability to relax the thermal stress generated by the difference in thermal expansion of the ceramic coating layer and the base is greet and when it is used under the condition of a great temperature gradient occurring in the ceramic coating layer, namely, under a great heat flux condition, for example, when it is used for bucket and nozzle of high combustion gas in turbine parts, the ceramic coating layer hardly suffers damages such as peeling of the ceramic coating layer because of the high endurance and the thermal barrier effect which is an inherent object to provide the layer can be sufficiently maintained and the reliability of the parts is improved by the reduction of the temperature of the substrate metal which constitutes the parts and the life of the parts can be prolonged. Furthermore, since the thermal barrier effect can be obtained stably, the amount of air for cooling the blades of gas turbines can be reduced and efficiency of power generation by turbines can be enhanced.

The ceramic coating layer of the present invention has two-layer structure comprising a ceramic layer of columnar texture having thermal stress relaxing action and a ceramic layer of dense texture having no cracks which become starting points of breaking induced by the thermal stress. Therefore, when the product of the present invention is used under the condition of a great temperature gradient occurs in the ceramic coating layer, namely, under a great heat flux condition, for example, when it is used for high-performance cooling blades as turbine parts in the case of high combustion gas temperature, the ceramic coating layer hardly suffers damages such as peeling because of high endurance and the thermal barrier effect which is an inherent object to provide the layer can be sufficiently maintained and the reliability of the parts is improved by the reduction of the temperature of the substrate metal which constitutes the parts and the life of the parts can be prolonged. Furthermore, since the thermal barrier effect can be obtained stably, the amount of air for cooling the blades of gas turbines can be reduced and efficiency of electricity generation by turbines can be enhanced.

What is claimed is:

1. A gas turbine comprising an arrangement of buckets and nozzles, each bucket having a blade part, a platform, and a shank part and each nozzle having a blade part and platform, wherein each bucket provided at a disk is rotated by allowing a compressed combustion gas to pass through a nozzle and to collide against a bucket in which temperature of the combustion gas is 1500° C. or higher, temperature of the combustion gas at an inlet for a blade part of a bucket of a first stage is 1300° C. or higher, the bucket of the first stage has a whole length of at least 200 mm, the platform of said bucket has a flat portion connected to the blade part, the shank part is connected to the platform and has fins provided on both sides thereof and a dovetail connected thereto and a surface of a blade part of at least one of the bucket and the nozzle is covered with a heat-resistant coating layer comprising a $ZrO_2$ ceramic layer having a columnar texture composed of a plurality of columnar $ZrO_2$ materials divided by micro-cracks and extending in a direction appropriately normal to the surface of the blade part, each of said columnar $ZrO_2$ materials comprising a plurality of smaller columnar $ZrO_2$ textures oriented appropriately normal to the surface of the blade part.

2. A combined power generating plant system provided with a gas turbine driven by a combustion gas flowing at a high speed, a waste heat recovering boiler for obtaining steam by combustion exhaust gas from the gas turbine, a steam turbine driven by the steam, and a generator driven by the gas turbine and the steam turbine wherein the gas turbine has an arrangement of buckets and nozzles, each bucket having a blade part, a platform and a shank part, and each nozzle having a blade part, said buckets of the gas turbine being provided on a disk and rotated by causing a compressed combustion gas to pass through a nozzle and collide against a bucket, wherein the temperature of the combustion gas at an inlet of a first stage bucket is 1300° C. or higher, the temperature of the combustion exhaust gas at the outlet of the gas turbine is 560° C. or higher, steam of 530° C. or higher is obtained by the waste heat recovering boiler, the steam turbine is of high and low pressure integrated type, the steam temperature at a first stage bucket of the steam turbine is 530° C. or higher, the power generation capacity of the gas turbine is at least 50,000 KW and that of the steam turbine is at least 30,000 KW, overall thermal efficiency of the system is at least 45%, the bucket of the first stage of the gas turbine having a whole length of at least 200 mm, the platform of said bucket having flat portion connected to the blade part, the shank part is connected to the platform, and has fins provided on both sides thereof and a dovetail connected thereto, a surface of the blade part of at least one of the bucket and the nozzle is covered with a heat-resistant coating layer comprising a $ZrO_2$ ceramic layer having a columnar texture composed of a plurality of columnar $ZrO_2$ materials divided by micro-cracks and extending in a direction appropriately normal to the surface of the blade part, each of said columnar $ZrO_2$ materials comprising a plurality of smaller columnar $ZrO_2$ textures oriented appropriately normal to the surface of the blade part.

* * * * *